United States Patent [19]
Kusumoto et al.

[11] Patent Number: 5,945,935
[45] Date of Patent: Aug. 31, 1999

[54] A/D CONVERTER AND A/D CONVERSION METHOD

[75] Inventors: Keiichi Kusumoto, Hyogo; Akira Matsuzawa, Kyoto, both of Japan

[73] Assignee: Matsushita Electric Industrial Co., Ltd., Osaka, Japan

[21] Appl. No.: 08/974,708

[22] Filed: Nov. 19, 1997

[30] Foreign Application Priority Data

Nov. 21, 1996 [JP] Japan .................................. 8-310244

[51] Int. Cl.[6] .................................................. H03M 1/36
[52] U.S. Cl. .......................................... 341/159; 341/166
[58] Field of Search .................................... 341/158, 159, 341/166, 155

[56] References Cited

U.S. PATENT DOCUMENTS 5,877,720 3/1999 Setty et al. ............................... 341/159

Primary Examiner—Marc S. Hoff
Attorney, Agent, or Firm—McDermott, Will & Emery

[57] ABSTRACT

The A/D converter realizes a high-rate and high-precision A/D conversion using amplifier circuits. Each amplifier circuit amplifies a difference between the voltage of an analog signal to be converted and a predetermined reference voltage. Each bank of holding circuits holds the output signals of an oscillator circuit, the levels of which signals are variable with the passage of time, when the output voltage of the associated amplifier circuit exceeds a predetermined value. The signals held in each said bank of holding circuits are output as a value representing the amplification time of the associated amplifier circuit. An operation means identifies a first amplifier circuit having a reference voltage higher than the analog signal voltage and a second amplifier circuit having a reference voltage lower than the analog signal voltage based on the values representing the amplification times, and determines a voltage, at a point interiorly dividing a difference between the reference voltages of the first and the second amplifier circuits by a ratio of the amplification time of the second amplifier circuit to the amplification time of the first amplifier circuit, as the analog signal voltage, thereby computing a digital value representing the analog signal.

12 Claims, 13 Drawing Sheets

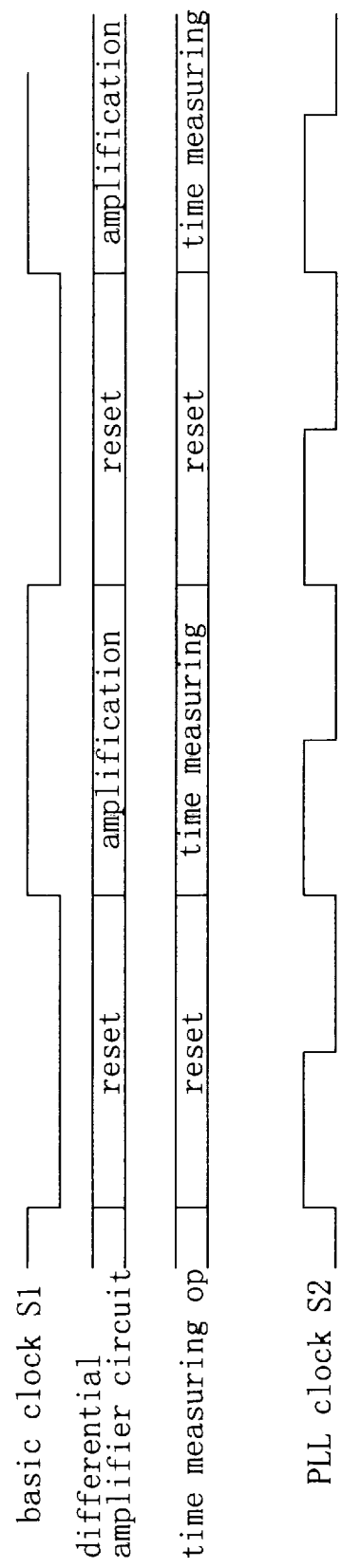

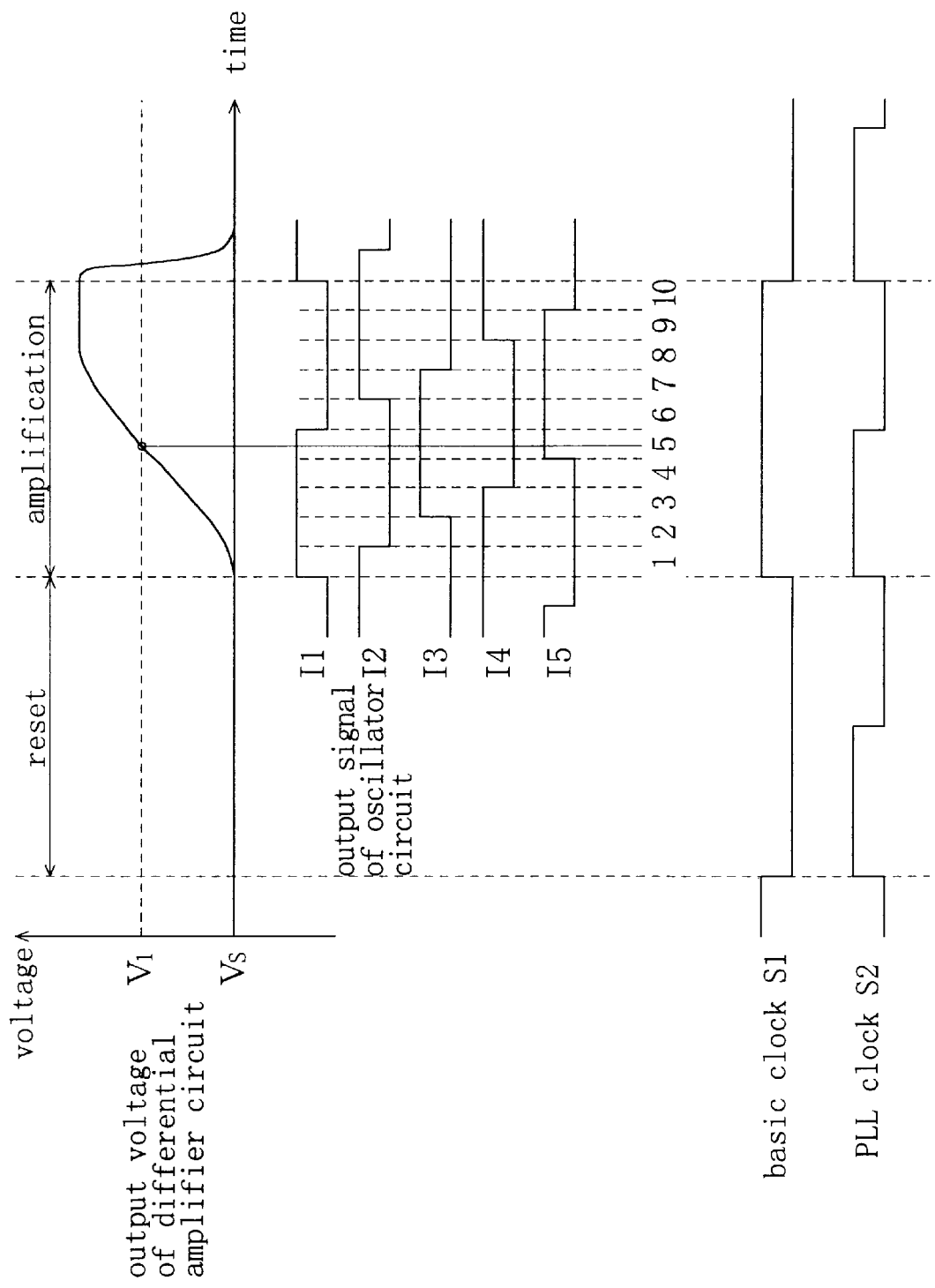

dynamic offset = $V_1 - V_2$

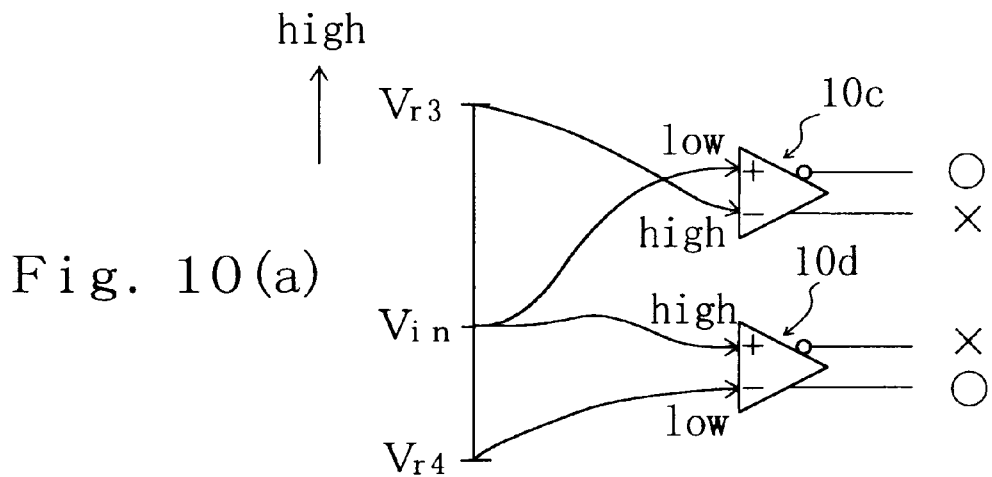
Fig. 10(a)
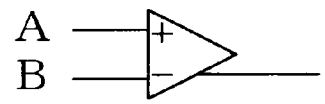
Fig. 10(b)
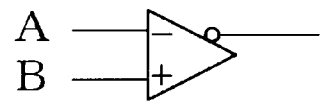
Fig. 10(c)
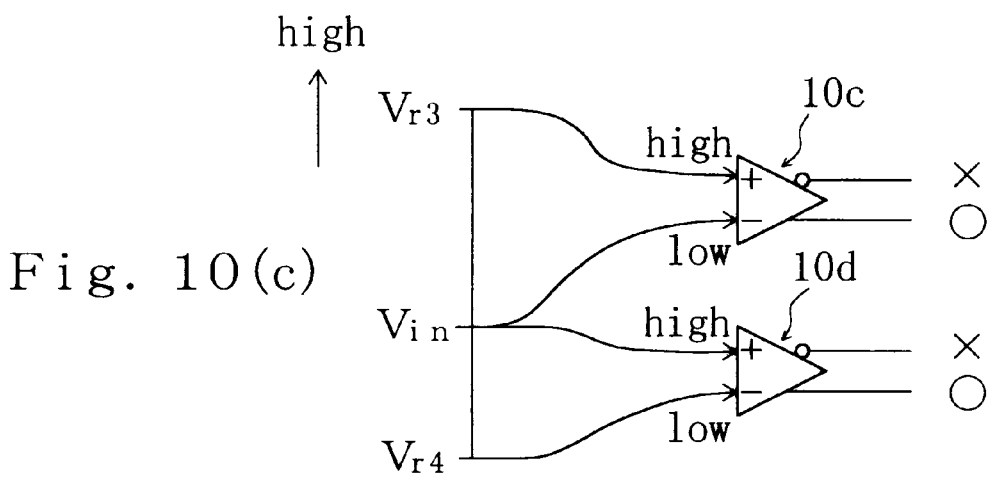

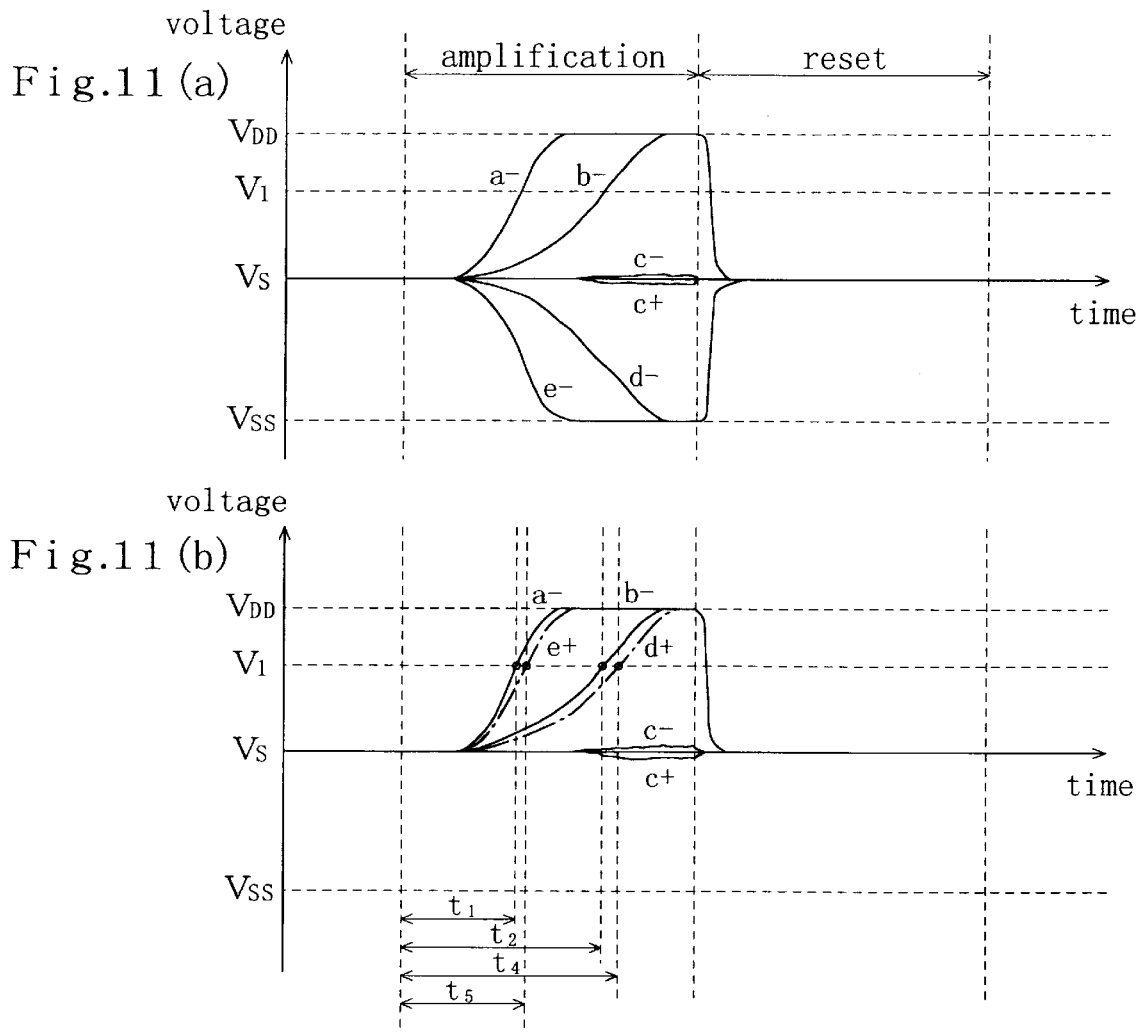

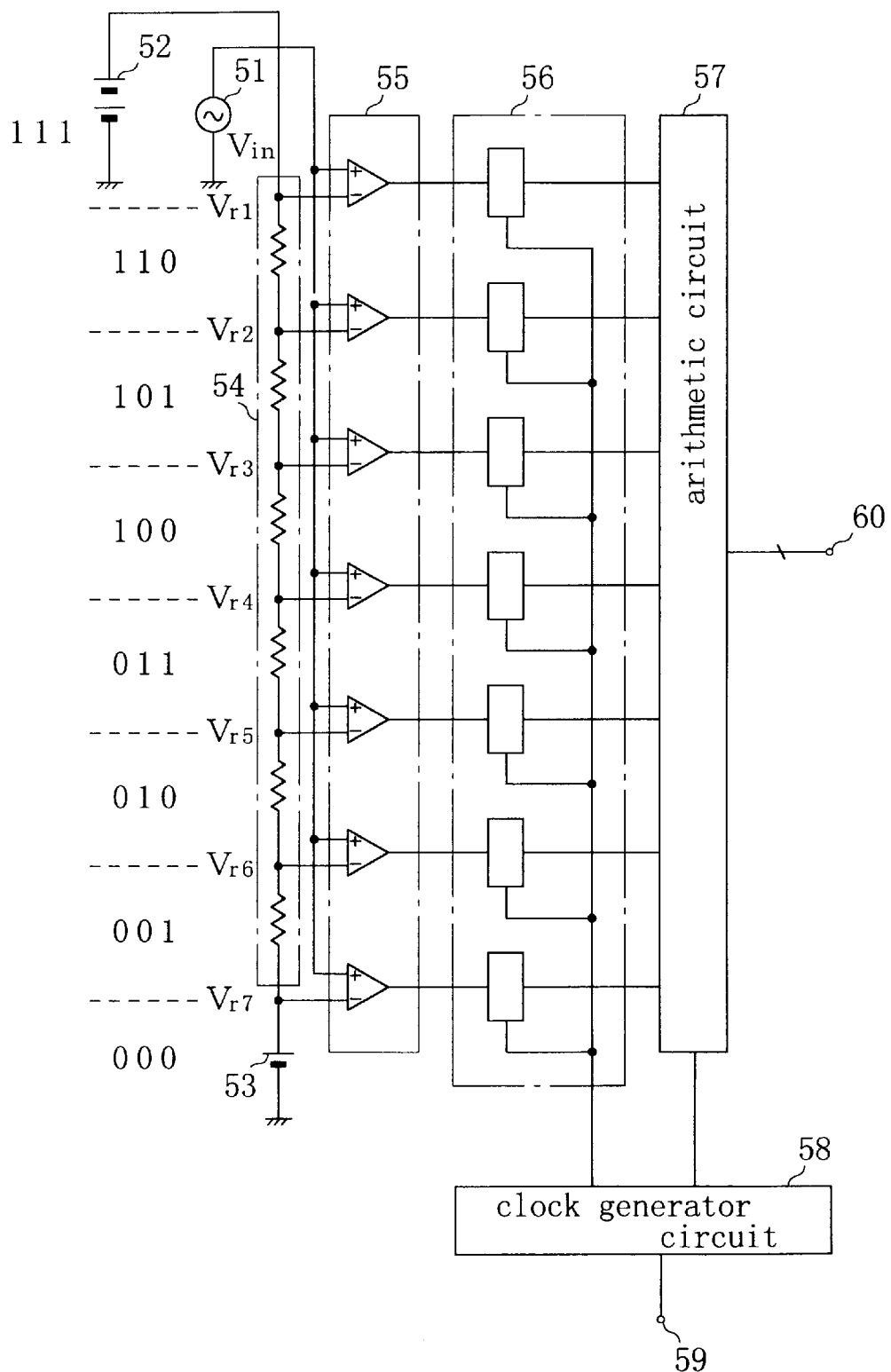

A/D CONVERTER AND A/D CONVERSION METHOD

BACKGROUND OF THE INVENTION

The present invention relates to an A/D converter and an A/D conversion method for converting an analog signal into a digital value.

FIG. 14 is a circuit diagram showing a configuration of a conventional A/D converter. In FIG. 14, the reference numeral 51 denotes an analog signal source for generating an analog signal $V_{in}$ to be converted. The reference numerals 52 and 53 denote constant voltage sources. The reference numeral 54 denotes a bank of resistors for generating reference voltages $V_{r1}$ to $V_{r7}$ by equally dividing a difference between the output voltages of the constant voltage sources 52 and 53. The reference numeral 55 denotes a bank of amplifier circuits. Each of the amplifier circuits amplifies a voltage difference between the voltage of the analog signal $V_{in}$ and the associated reference voltage $V_{r1}$, $V_{r2}$, $V_{r3}$, $V_{r4}$, $V_{r5}$, $V_{r6}$ or $V_{r7}$. The reference numeral 56 denotes a bank of latch circuits. Each of the latch circuits amplifies the output voltage of the associated amplifier circuit into a digital value and then holds the digital value. The reference numeral 57 denotes an arithmetic circuit for encoding the output signals of the bank of latch circuits 56 into A/D converted values. The reference numeral 58 denotes a clock generator circuit for operating the bank of latch circuits 56 and the arithmetic circuit 57. The reference numeral 59 denotes an input terminal through which a clock is input as a reference of the output clock of the clock generator circuit 58. The reference numeral 60 denotes an output terminal through which the A/D converted values calculated by the arithmetic circuit 57 are output.

For example, it is assumed that the voltage of the analog signal $V_{in}$ is located between the reference voltages $V_{r3}$ and $V_{r4}$. In this case, in the first to the third amplifier circuits of the bank 55 of amplifier circuits, since the non-inverting input voltage (i.e., the voltage of the analog signal $V_{in}$) is lower than the inverting input voltages (i.e., the reference voltages $V_{r1}$ to $V_{r3}$), the first to the third amplifier circuits output negative voltages. On the other hand, in the fourth to the seventh amplifier circuits of the bank 55 of amplifier circuits, since the non-inverting input voltage (i.e., the voltage of the analog signal $V_{in}$) is higher than the inverting input voltages (i.e., the reference voltages $V_{r4}$ to $V_{r7}$), the fourth to the seventh amplifier circuits output positive voltages. In the bank 55 of amplifier circuits, the point, at which the polarity of the output voltage of an amplifier circuit is switched from positive into negative or from negative into positive, is variable depending upon the voltage of the analog signal $V_{in}$ in this way. Thus, the analog signal $V_{in}$ can be A/D converted based on this switching point.

The bank 56 of latch circuits amplifies the output voltages of the bank 55 of amplifier circuits to be logical voltages ($V_{DD}$: 1, $V_S$: 0) and holds the logical voltages. The arithmetic circuit 57 converts the values held in the latch circuits 56 into three-bit A/D converted values such as those shown in FIG. 14. More specifically, a voltage lower than the reference voltage $V_{r7}$ is converted into "000", a voltage higher than the reference voltage $V_{r1}$ is converted into "111" and voltages intermediate between the reference voltages $V_{r1}$ to $V_{r7}$ are converted into "001" to "110". In this example, the value held in the bank 56 of latch circuits becomes "0001111" (herein, it is assumed that when the output voltage of an amplifier circuit is negative, a value held in a latch circuit is "0" and that when the output voltage of an amplifier circuit is positive, a value held in a latch circuit is "1"), the analog signal $V_{in}$ is converted by the arithmetic circuit 57 into "100" and the data "100" is output through the output terminal 60.

However, such a conventional A/D converter has the following problems.

In a conventional A/D converter such as that shown in FIG. 14, the positive/negative polarities of the output voltages of the respective differential amplifier circuits for amplifying the voltage differences between the voltage of the analog signal $V_{in}$ and the reference voltages $V_{r1}$ to $V_{r7}$ are used as the information about an A/D conversion. In other words, the A/D conversion is performed based on the level relationship between the voltage of the analog signal $V_{in}$ and the reference voltages $V_{r1}$ to $V_{r7}$.

In such an A/D converter, the conversion precision is determined by a difference between two adjacent reference voltages, i.e., by the width of a scale used in dividing a voltage difference between the output voltages of the constant voltage sources 52 and 53. For example, in order to realize an eight-bit A/D converter, the voltage difference between the output voltages of the constant voltage sources 52 and 53 is required to be divided into 256 ($=2^8$) scales. Assuming that the voltage difference between the output voltages of the constant voltage sources 52 and 53 is 2 V, a voltage per scale becomes about 8 mV.

Thus, in order to improve the conversion precision, a voltage per scale is required to be even smaller.

On the other hand, when the prior art A/D converter was described, the differential amplifier circuits were assumed to be ideal circuits. However, a real differential amplifier circuit has an offset voltage. Thus, if a voltage per scale is reduced, then the influence of the offset voltage increases correspondingly, thereby preventing the conversion precision from being improved.

Assuming that the offset voltage of a differential amplifier circuit is denoted by $V_{OS}$, a substantial reference voltage becomes a sum of a reference voltage ($V_{r3}$, for example) and the offset voltage $V_{OS}$. In such a case, though the positive/negative polarities of the output voltages are theoretically switched at a point where the voltage of the analog signal $V_{in}$ becomes equal to the reference voltage $V_{r3}$, the positive/negative polarities of the output voltages are actually switched at a point where the voltage of the analog signal $V_{in}$ becomes equal to a voltage ($V_{r3}+V_{OS}$).

In an eight-bit A/D converter, an error per scale is defined as ±4 mV. Thus, a voltage per scale must be from 4 mV to 12 mV (i.e., 8±4 mV). That is to say, in order to prevent the above-described problem, the offset voltage $V_{OS}$ must be within ±4 mV.

However, the offset voltage $V_{OS}$ of a real amplifier circuit is equal to or higher than ±10 mV (in the case of an MOS transistor). Consequently, in the case of using an MOS transistor, the prior art cannot realize an A/D converter having a precision of 8 bits or more.

SUMMARY OF THE INVENTION

The present invention provides an A/D converter and an A/D conversion method realizing a high-rate and high-precision A/D conversion.

Specifically, the present invention provides an A/D converter for converting an analog signal into a digital value. The A/D converter includes a plurality of amplifier circuits. Each of the amplifier circuit amplifies a voltage difference between a voltage of the analog signal to be converted and a predetermined reference voltage associated with the amplifier circuit. The A/D converter further includes a conversion section for obtaining the digital value representing the analog signal based on amplification rates of the respective amplifier circuits.

In each of the amplifier circuits, the larger the voltage difference between the voltage of the analog signal and the associated reference voltage becomes, the higher the amplification rate of the amplifier circuit becomes (or the shorter the amplification time thereof becomes). Conversely, the smaller the voltage difference between the voltage of the analog signal and the associated reference voltage becomes, the lower the amplification rate of the amplifier circuit becomes (or the longer the amplification time thereof becomes). Thus, the difference in amplification rates of the respective amplifier circuits represents the difference in voltage differences between the voltage of the analog signal and the reference voltages associated with the respective amplifier circuits. Therefore, by performing an A/D conversion based on the amplification rates of the respective amplifier circuits, it is possible to obtain the point, at which the voltage of the analog signal is located and which could not be obtained by the prior art using only the level relationship between the voltage of the analog signal and the respective reference voltages as the information about the A/D conversion. Consequently, it is possible to realize an A/D conversion of a higher precision than that of the conventional A/D conversion which has been limited by the variations in offset voltages proper to the amplifier circuits.

In one embodiment of the present invention, the conversion section preferably includes time counting means for counting respective amplification times of the plurality of amplifier circuits, and operation means for computing the digital value representing the analog signal based on a plurality of count values output from the time counting means.

Under such a configuration, the plurality of count values output from the time counting means represent the amplification times of the respective amplifier circuits, each amplifying the voltage difference between the voltage of the analog signal to be converted and the predetermined reference voltage associated with each said amplifier circuit. The amplification time of each said amplifier circuit may be defined, for example, as a time period after the output voltage of the amplifier circuit reaches a start point voltage and until the output voltage reaches a predetermined voltage. As described above, the difference in amplification rates of the amplifier circuits represents the difference in voltage differences between the voltage of the analog signal and the reference voltages associated with the respective amplifier circuits. Thus, the amplification time of each said amplifier circuit also corresponds to the voltage difference between the voltage of the analog signal and the associated reference voltage thereof. Therefore, the voltage of the analog signal can be located between adjacent reference voltages based on the plurality of values output from the time counting means. Consequently, the digital value representing the analog signal can be calculated with a higher precision than that of the conventional A/D converter.

In another embodiment of the present invention, the time counting means preferably includes an oscillator circuit for outputting signals having levels variable with the passage of time, and a plurality of holding circuit banks provided so as to be associated with the respective amplifier circuits. Each said holding circuit bank holds the output signals of the oscillator circuit when an output voltage of the amplifier circuit associated with each said holding circuit bank reaches a predetermined voltage. As a result, the time counting means obtains the values representing the amplification times of the respective amplifier circuits based on the signals held by the holding circuit banks.

Under such a configuration, when the output voltage of an amplifier circuit reaches a predetermined value, the output signals of the oscillator circuit having levels variable with the passage of time are held in the holding circuit bank associated with the amplifier circuit. Thus, the signals held in the holding circuit bank become signals corresponding to the amplification time of the associated amplifier circuit. Consequently, the time counting means can obtain with certainty the value representing the amplification time of each said amplifier circuit based on the signals held in the holding circuit bank.

In still another embodiment of the present invention, the operation means preferably identifies a first amplifier circuit having a reference voltage higher than the voltage of the analog signal and a second amplifier circuit having a reference voltage lower than the voltage of the analog signal from the plurality of amplifier circuits based on the plurality of count values output from the time counting means, and preferably determines a voltage, being located at point interiorly dividing a difference between the reference voltage of the first amplifier circuit and the reference voltage of the second amplifier circuit by a ratio of the amplification time of the second amplifier circuit to the amplification time of the first amplifier circuit, as the voltage of the analog signal.

Under such a configuration, the voltage of the analog signal can be located more precisely between the reference voltage of the first amplifier circuit and the reference voltage of the second amplifier circuit by using the amplification time of the first amplifier circuit and the amplification time of the second amplifier circuit. As a result, the digital value representing the analog signal can be calculated more precisely as compared with the conventional A/D converter. In addition, since the A/D conversion is performed by comparing the measured amplification times with each other, the conversion error owing to a power supply voltage, a temperature or the like can be suppressed, thereby improving the precision of the A/D conversion.

In still another embodiment of the present invention, the conversion section preferably obtains the digital value representing the analog signal based on either one type of output voltage of a non-inverted output voltage and an inverted output voltage for the amplifier circuit having reference voltage lower than the voltage of the analog signal among the plurality of amplifier circuits and based on the other type of output voltage of a non-inverted output voltage and an inverted output voltage for the amplifier circuit having reference voltage higher than the voltage of the analog signal, respectively.

Under such a configuration, all of the output voltages of the amplifier circuits used for the A/D conversion of the analog signal are concentrated either in a voltage region higher than the voltage used as a reference of amplification or in a voltage region lower than the voltage used as the reference of amplification. Thus, since the influences of the offset voltages of the respective amplifier circuits are canceled each other, the precision of the A/D conversion can be improved.

The present invention also provides an A/D conversion method for converting an analog signal into a digital value. The A/D conversion method includes a conversion process of obtaining the digital value representing the analog signal by using a plurality of amplifier circuits, each said amplifier circuit amplifying a voltage difference between a voltage of the analog signal to be converted and a predetermined reference voltage associated with each said amplifier circuit, based on amplification rates of the respective amplifier circuits.

According to the present invention, in each said amplifier circuit, the larger the voltage difference between the voltage of the analog signal and the associated reference voltage becomes, the higher the amplification rate of the amplifier circuit becomes (or the shorter the amplification time thereof becomes). Conversely, the smaller the voltage difference between the voltage of the analog signal and the associated reference voltage becomes, the lower the amplification rate of the amplifier circuit becomes (or the longer the amplification time thereof becomes). Thus, the difference in amplification rates of the amplifier circuits represents the difference in voltage differences between the voltage of the analog signal and the reference voltages of the respective amplifier circuits. Therefore, by performing an A/D conversion based on the amplification rates of the respective amplifier circuits, it is possible to obtain the point, at which the voltage of the analog signal is located and which could not be obtained by the prior art using only the level relationship between the voltage of the analog signal and the respective reference voltages as the information about the A/D conversion. Consequently, it is possible to realize an A/D conversion of a higher precision than that of the conventional A/D conversion which has been limited by the variations in offset voltages proper to the amplifier circuits.

In one embodiment of the present invention, the conversion process preferably includes a first step of obtaining a first time required for a first amplifier circuit having a reference voltage higher than the voltage of the analog signal to perform an amplification and a second time required for a second amplifier circuit having a reference voltage lower than the voltage of the analog signal to perform an amplification, and a second step of determining a voltage, being located at a point interiorly dividing a difference between the reference voltage of the first amplifier circuit and the reference voltage of the second amplifier circuit by a ratio of the second time to the first time, as the voltage of the analog signal.

In accordance with such a method, the voltage of the analog signal can be located more precisely between the reference voltage of the first amplifier circuit and the reference voltage of the second amplifier circuit by using the amplification time of the first amplifier circuit and the amplification time of the second amplifier circuit. As a result, the digital value representing the analog signal can be calculated more precisely as compared with the conventional A/D conversion method. In addition, since the A/D conversion is performed by comparing the measured amplification times with each other, the conversion error owing to a power supply voltage, a temperature or the like can be suppressed, thereby improving the precision of the A/D conversion.

In another embodiment of the present invention, in the first step, the first time is preferably obtained based on either one type of output voltage of a non-inverted output voltage and an inverted output voltage of the first amplifier circuit, while the second time is preferably obtained based on the other type of output voltage of a noninverted output voltage and an inverted output voltage of the second amplifier circuit.

In accordance with such a method, both of the output voltages of first and second amplifier circuits used for the A/D conversion of the analog signal are concentrated either in a voltage region higher than the voltage used as a reference of amplification or in a voltage region lower than the voltage used as the reference of amplification. Therefore, since the influences of the offset voltages of the first and the second amplifier circuits are canceled each other, the precision of the A/D conversion can be improved.

BRIEF DESCRIPTION OF THE DRAWINGS

FIG. 2 is a drawing illustrating an example of a differential amplifier circuit constituting the A/D converter in the embodiment of the present invention.

FIG. 6 is a timing chart illustrating the generalized operation of the A/D converter in the embodiment of the present invention shown in FIG. 1.

FIG. 7 is a diagram illustrating an operation for measuring the amplification time of an output voltage of a differential amplifier circuit.

FIGS. 10(a), 10(b) and 10(c) are diagrams explaining the reasons why the influence of the dynamic offset can be reduced in the embodiment of the present invention.

FIGS. 11(a) and 11(b) are diagrams illustrating how the A/D converted value is obtained in the embodiment of the present invention.

FIG. 14 is a circuit diagram showing the configuration of a conventional A/D converter.

DESCRIPTION OF THE PREFERRED EMBODIMENTS

Hereinafter, the A/D converter in an embodiment of the present invention will be described in detail with reference to the accompanying drawings.

Figure 1:
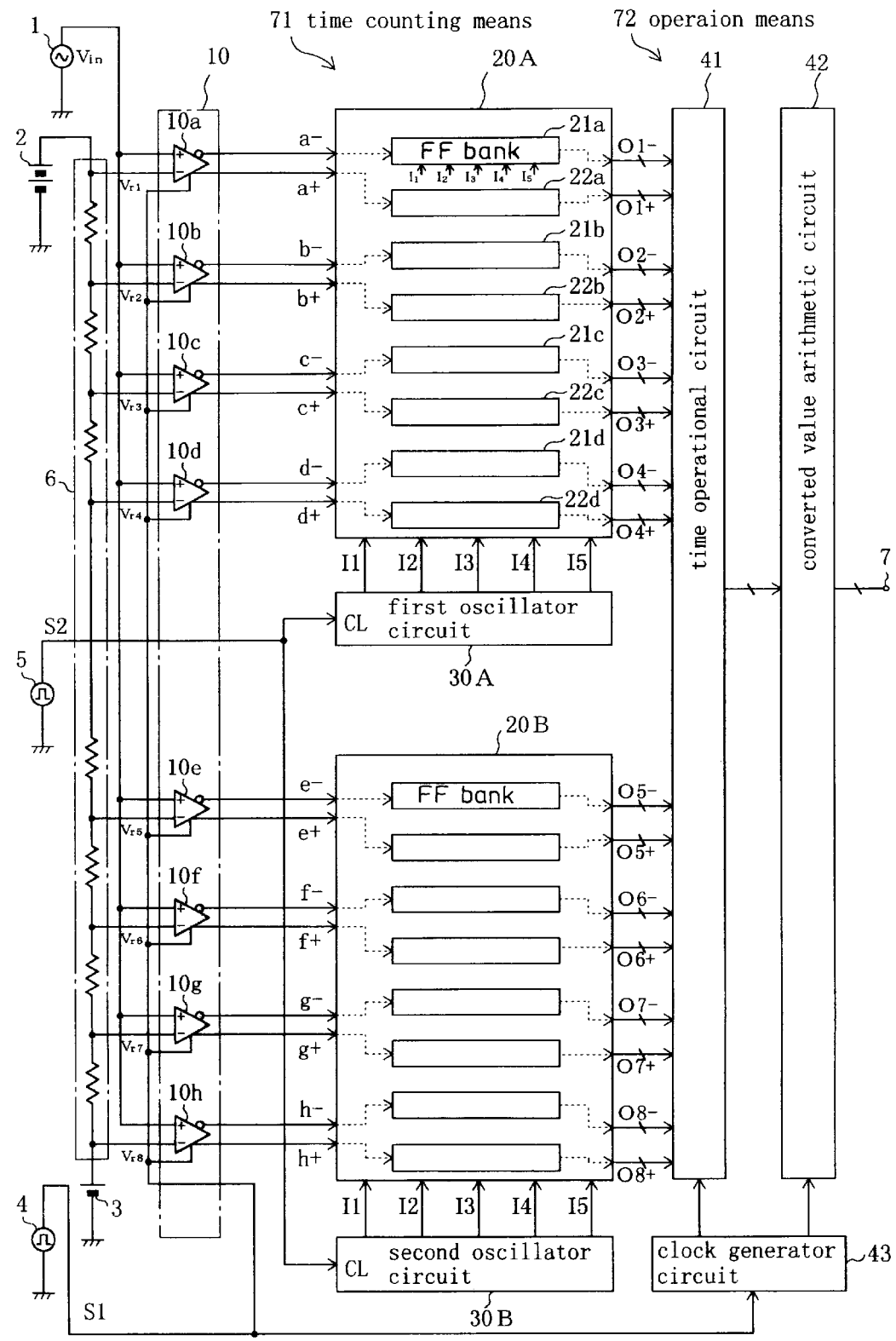
FIG. 1 is a circuit diagram of the A/D converter in an embodiment of the present invention.

FIG. 1 is a circuit diagram showing the configuration of the A/D converter in an embodiment of the present invention. In FIG. 1, the reference numeral 1 denotes an analog signal source for generating an analog signal $V_{in}$ to be converted. The reference numeral 2 denotes a first constant voltage source for outputting a voltage as an upper limit of reference voltages. The reference numeral 3 denotes a second constant voltage source for outputting a voltage as a lower limit of the reference voltages. The reference numeral 4 denotes a first clock generating source for outputting a basic clock S1 as a first clock signal for driving respective differential amplifier circuits 10a to 10h constituting a bank 10 of amplifier circuits to be described later. The reference numeral 5 denotes a second clock generating source for outputting a PLL clock S2 as a second clock signal for driving a first oscillator circuit 30A and a second oscillator circuit 30B to be described later. The reference numeral 6 denotes a bank of resistors including serially connected resistors and generating the reference voltages $V_{r1}$ to $V_{r8}$ by dividing a differential between the output voltages of the first and the second constant voltage sources 2 and 3. The reference numeral 7 denotes an output terminal for outputting a digital value as a product of the A/D conversion of the analog signal $V_{in}$.

The reference numeral 10 denotes a bank of amplifier circuits consisting of a first to an eighth differential amplifier circuit 10a to 10h. Each of the differential amplifier circuits amplifies a voltage difference between the voltage of the analog signal $V_{in}$ and the associated reference voltage $V_{r1}$, $V_{r2}$, $V_{r3}$, $V_{r4}$, $V_{r5}$, $V_{r6}$, $V_{r7}$ or $V_8$ which has been output from the bank 6 of resistors. For example, the first differential amplifier circuit 10a amplifies a voltage difference between the voltage of the analog signal $V_{in}$ and the reference voltage $V_{r1}$, thereby outputting a non-inverted output voltage a+ and an inverted output voltage a−. Similarly, the second to the eighth differential amplifier circuits 10b to 10h amplify the respective voltage differences between the voltage of the analog signal $V_{in}$ and the associated reference voltage $V_{r2}$, $V_{r3}$, $V_{r4}$, $V_{r5}$, $V_{r6}$, $V_{r7}$ or $V_{r8}$, thereby outputting non-inverted output voltages b+ to h+ and inverted output voltages b− to h−, respectively.

The reference numerals 20A and 20B denote a first and a second group of flip-flop banks, each group 20A, 20B including a plurality of flip-flop banks (FF banks) as holding circuit banks. The reference numerals 30A and 30B denote a first and a second oscillator circuit, each being constituted by a phase locked loop (PLL), for measuring the amplification rates (or the amplification times) of the respective differential amplifier circuits 10a to 10h constituting the bank 10 of amplifier circuits. The respective FF banks constituting the first group 20A of flip-flop banks output digital values O1−, O1+ to O4− to O4+ representing the times required for the respective output voltages a−, a+ to d−, d+ of the first to the fourth differential amplifier circuits 10a to 10d to change from the start-point voltage into the voltage used as a reference by using the output signals $I_1$ to $I_5$ of the first oscillator circuit 30A. Similarly, the respective FF banks constituting the second group 20B of flip-flop banks output digital values O5−, O5+ to O8− to O8+ representing the times required for the respective output voltages e−, e+ to h−, h+ of the fifth to the eighth differential amplifier circuits 10e to 10h to change from the start-point voltage into the voltage used as a reference by using the output signals $I_1$ to $I_5$ of the second oscillator circuit 30B. A time counting means 71 is constituted by the first and the second groups 20A and 20B of flip-flop banks and the first and the second oscillator circuits 30A and 30B.

The reference numeral 41 denotes a time operational circuit for performing operations for the lower-order A/D conversion in accordance with the digital values which represent the amplification rates or the amplification times of the respective differential amplifier circuits 10a to 10h of the bank 10 of amplifier circuits and which have been output from the first and the second groups 20A and 20B of flipflop banks. The reference numeral 42 denotes a converted value arithmetic circuit for computing the A/D converted value based on the output data of the time operational circuit 41. The reference numeral 43 denotes a clock generator circuit for generating a clock signal for operating the time operational circuit 41 and the converted value arithmetic circuit 42 in response to the first clock signal S1 output from the first clock generating source 4. An operation means 72 consists of the time operational circuit 41 and the converted value arithmetic circuit 42. A conversion section for obtaining the digital value representing the analog signal $V_{in}$ to be converted based on the amplification rates of the respective differential amplifier circuits 10a to 10h is constituted by the time counting means 71 and the operation means 72.

Hereinafter, the principal sections of the A/D converter in the embodiment shown in FIG. 1 will be described in more detail with reference to FIGS. 2 to 5.

Figure 2A:
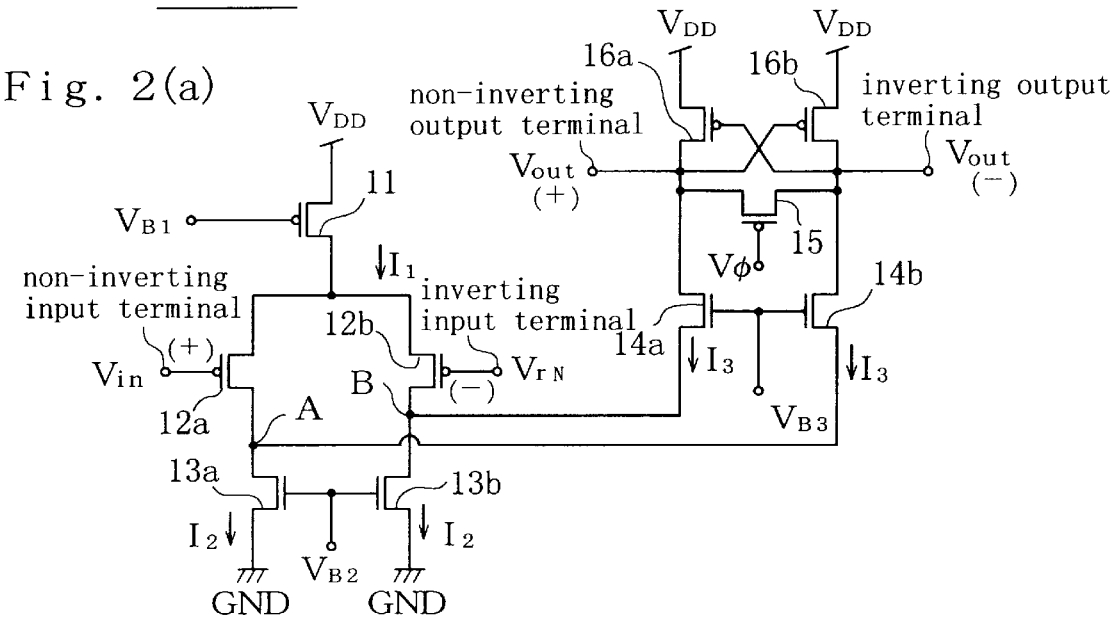
FIG. 2(a) is a circuit diagram showing an exemplary configuration of the differential amplifier circuit.
Figure 2B:
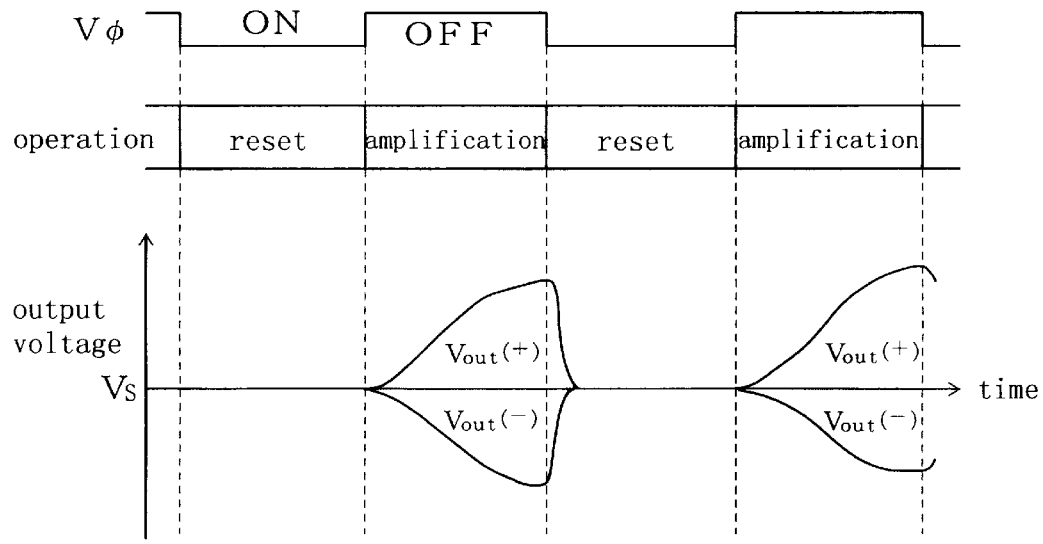
FIG. 2(b) is a timing chart illustrating the operation of the differential amplifier circuit.

First, the differential amplifier circuits 10a to 10h constituting the bank 10 of amplifier circuits will be described. FIG. 2 is a drawing illustrating an example of the differential amplifier circuit 10a to 10h constituting the bank 10 of amplifier circuits of the A/D converter in this embodiment. FIG. 2(a) is a circuit diagram showing an exemplary configuration of the differential amplifier circuit. FIG. 2(b) is a timing chart illustrating the operation of the differential amplifier circuit shown in FIG. 2(a). In FIG. 2(a), the reference numerals 11, 12a, 12b, 15, 16a and 16b denote P-type MOS transistors (hereinafter, abbreviated as "PMOSs"), and the reference numerals 13a, 13b, 14a and 14b denote N-type MOS transistors (hereinafter, abbreviated as "NMOSs").

A constant voltage $V_{B1}$ is applied to the gate terminal of the PMOS 11, which functions as a constant current source. The PMOSs 12a and 12b forms a differential pair. The analog signal $V_{in}$ is input to the gate terminal (i.e., the non-inverting input terminal of the differential amplifier circuit) of the PMOS 12a, while a reference voltage $V_{rN}$ (where N is an integer from 1 to 8) is input to the gate terminal (i.e., the inverting input terminal of the differential amplifier circuit) of the PMOS 12b. A constant voltage $V_{B2}$ is applied to the gate terminals of the NMOSs 13a and 13b, which function as a constant current source.

Herein, the current flowing from the PMOS 11 functioning as a constant current source into the interconnection terminal between the sources of the PMOSs 12a and 12b is assumed to be denoted by $I_1$, the current derived by the NMOSs 13a and 13b from terminals A and B is assumed to be denoted by $I_2$ and the current flowing from the NMOS transistors 14a and 14b into the terminals A and B is assumed to be denoted by $I_3$. When the input voltage $V_{in}$ is equal to the reference voltage $V_{rN}$, the current flowing through the PMOS 12a is equal to the current flowing through the PMOS 12b and becomes ($I_1/2$). In this case, at the terminals A and B, the relationship given the following Equation (1) is satisfied.

$$I_1/2 - I_2 + I_3 = 0 \qquad (1)$$

When the differential amplifier circuit is in the balanced state, this Equation (1) is satisfied. In this case, no current flows between the drain and the source of the PMOS 15, no matter whether the PMOS 15 is in the closed state (i.e., the ON state) or in the opened state (i.e., the OFF state). Consequently, the voltages at the output terminals of the differential amplifier circuit do not vary. That is to say, when the differential amplifier circuit is in the balanced state, the non-inverted output voltage $V_{out}(+)$ becomes equal to the inverted output voltage $V_{out}(-)$.

As shown in FIG. 2(b), when a voltage $V_{100}$ is at the low level, the PMOS 15 is turned into the closed state (ON state), and the both the non-inverted output voltage and the inverted output voltage of the differential amplifier circuit become equal to a voltage $V_S$ irrespective of the values of the non-inverting input voltage $V_{in}$ and the inverting input voltage $V_{rN}$. For example, when the non-inverting input voltage $V_{in}$ is higher than the inverting input voltage $V_{rN}$, current larger than $(I_1/2)$ by $\Delta I$ flows through the PMOS 12b. However, since the gate voltage of the NMOS 13b is a constant voltage $V_{B2}$, the current $I_2$ does not vary. As a result, the current $I_3$ flowing into the terminal B decreases by $\Delta I$ because the Kirchhoff's law is applied to the terminal B. Similarly, current smaller than $(I_1/2)$ by $\Delta I$ flows through the PMOS 12a. However, since the gate voltage of the NMOS 13a is a constant voltage $V_{B2}$, the current $I_2$ does not vary. As a result, the current $I_3$ flowing into the terminal A increases by $\Delta I$ because the Kirchhoff's law is applied to the terminal A. Consequently, the current flowing through the PMOSs 16a and 16b does not vary, and the voltage $V_S$ corresponding to the balanced state of the differential amplifier circuit is output from both of the non-inverted output terminal and the inverted output terminal. The operation of the differential amplifier circuit during such a state is called a "reset operation".

On the other hand, when the voltage $V_\phi$ is at the high level, the PMOS 15 is turned into the opened state (OFF state), and the output voltages are amplified. For example, when the non-inverting input voltage $V_{in}$ is higher than the inverting input voltage $V_{rN}$, the current $\Delta I$ flows out from the non-inverted output terminal and flows into the inverted output terminal. As a result, the voltage $V_{out}(+)$ at the noninverted output terminal rises, whereas the voltage $V_{out}(-)$ at the inverted output terminal drops. The operation of the differential amplifier circuit during such a state is called an "amplification operation". The PMOSs 16a and 16b are cross-coupled to each other, in order to increase the variation rates of the voltages at the non-inverted output terminal and the inverted output terminal.

Next, the first and the second groups 20A and 20B of flip-flop banks will be described. Since the first and the second groups 20A and 20B of flip-flop banks have the same configuration, only the first group 20A of flip-flop banks will be described hereinafter.

Figure 3:
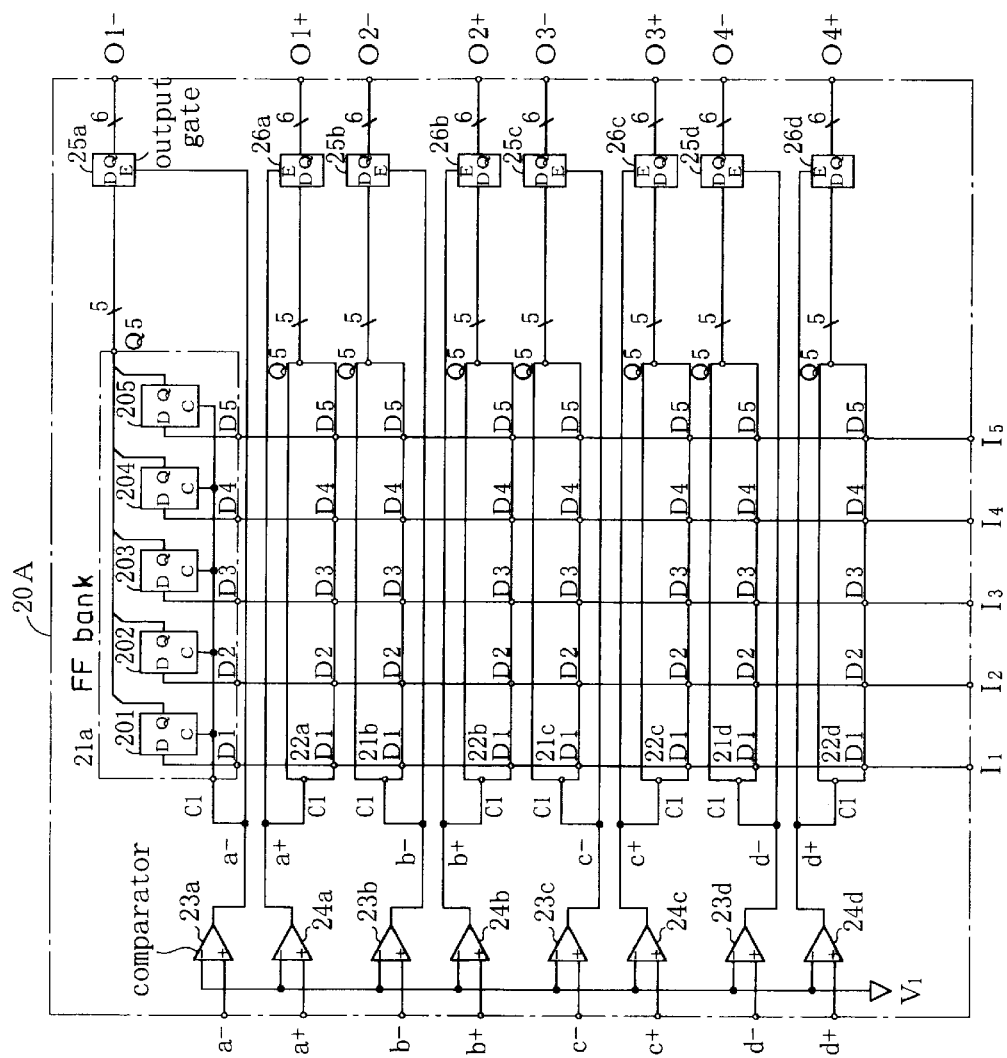
FIG. 3 is a circuit diagram showing the configuration of a first group 20A of flip-flop banks in the A/D converter in the embodiment of the present invention.

FIG. 3 is a circuit diagram showing the configuration of the first group 20A of flip-flop banks of the A/D converter in this embodiment. In FIG. 3, the reference numerals 21a, 22a, 21b, 22b, 21c, 22c, 21d and 22b are flip-flop banks functioning as holding circuit banks. Each bank of flip-flops holds the signals input through input terminals D1 to D5 in synchronism with the transition of the signal input through a clock terminal C1 and outputs the held signals as a digital value through a data output terminal Q5.

The flip-flop bank 21a is composed of five flip-flops 201 to 205. In each of the flip flops 201 to 205, the signal input through the clock terminal C1 of the flip-flop bank 21a is input to the clock terminal C thereof, and the signal input through the associated input terminal D1, D2, D3, D4 or D5 of the flip-flop bank 21a is input to the data input terminal D thereof. In this case, in synchronism with the leading edge of the signal input to the clock terminal C of each of the flip flops 201 to 205, each flip flop is assumed to hold the signal input to the terminal D and then output the signal to the terminal Q thereof. The signals output through the terminals Q of the respective flip flops 201 to 205 are output as five-bit data through the data output terminal Q5 of the flip-flop bank 21a. It is noted that the other flip-flop banks 21b to 21d and 22a to 22d have the same configuration as that of the flip-flop bank 21a (and the detailed configurations thereof are not shown in FIG. 3).

In addition, the first group 20A of flip-flop banks further includes comparators 23a, 24a, 23b, 24b, 23c, 24c, 23d and 24d, and output gates 25a, 26a, 25b, 26b, 25c, 26c, 25d and 26d, as shown in FIG. 3.

The inverted output voltages a– to d– of the first to the fourth differential amplifier circuits 10a to 10d constituting the bank 10 of amplifier circuits are input to the non-inverting input terminals of the comparators 23a to 23d, respectively. On the other hand, the non-inverted output voltages a+ to d+ of the first to the fourth differential amplifier circuits 10a to 10d constituting the bank 10 of amplifier circuits are input to the non-inverting input terminals of the comparators 24a to 24d, respectively. Moreover, a voltage $V_1$ used as a reference for measuring the amplification rates of the respective differential amplifier circuits 10a to 10d is input to all of the inverting input terminals of the comparators 23a to 23d and 24a to 24d. The output signals of the comparators 23a to 23d are supplied to the clock terminals C1 of the flip-flop banks 21a to 21d, respectively, while the output signals of the comparators 24a to 24d are supplied to the clock terminals C1 of the flip-flop banks 22a to 22d, respectively.

When the level of the voltage applied to the non-inverting input terminal of each comparator exceeds the voltage $V_1$ applied to the inverting input terminal thereof, the output signal of the comparator turns from the "L" level into the "H" level. In response thereto, the flip-flop bank, to which the output signal of the comparator is input through the clock terminal C1 thereof, holds the signals input through the input terminals D1 to D5. For example, the inverted output voltage a– of the first differential amplifier circuit 10a is input to the non-inverting input terminal of the comparator 23a. When the level of the voltage a– exceeds that of the voltage $V_1$, the output signal of the comparator 23a changes from the "L" level into the "H" level. Then, the flip-flop bank 21a holds the signals input to the input terminals D1 to D5 in synchronism with the transition of the output signal of the comparator 23a which has been input to the clock terminal C1.

In the output gates 25a to 25d, the output data of the flip-flop banks 21a to 21d are input to the respective terminals D thereof and the output signals of the comparators 23a to 23d are input to the respective control terminals E thereof, thereby outputting digital values O1– to O4– through the respective terminals Q thereof. On the other hand, in the output gates 26a to 26d, the output data of the flip-flop banks 22a to 22d are input to the respective terminals D thereof and the output signals of the comparators 24a to 24d are input to the respective control terminals E thereof, thereby outputting digital values O1+ to O4+ through the respective terminals Q thereof.

Each of the output gates 25a to 25d and 26a to 26d has the following properties. When the input voltage at the control terminal E thereof is at the "H" level, each gate adds bit "1" ("H" level) to the data input to the terminal D thereof and then outputs the six-bit data through the terminal Q thereof. On the other hand, when the input voltage at the control terminal E thereof is at the "L" level, each gate adds bit "0" ("L" level) to the data input to the terminal D thereof (or to predetermined data) and then outputs the six-bit data through the terminal Q thereof. The added bit "1" is assumed to indicate that the remaining five-bit data is effective as data representing the amplification rate of the differential amplifier circuit, while the added bit "0" is assumed to indicate that the remaining five-bit data is negligible data. For example, when the output signal of the comparator 23a which has been input to the control terminal E of the output gate 25a is at the "H" level, the output gate 25a adds the bit "1" to the output data of the flip-flop bank 21a which has been input to the terminal D thereof and then outputs the six-bit data through the terminal Q thereof.

Next, the first and the second oscillator circuits 30A and 30B will be described. Since the first and the second oscillator circuits 30A and 30B have the same configuration, only the oscillator circuit 30A will be described hereinafter.

Figure 4:
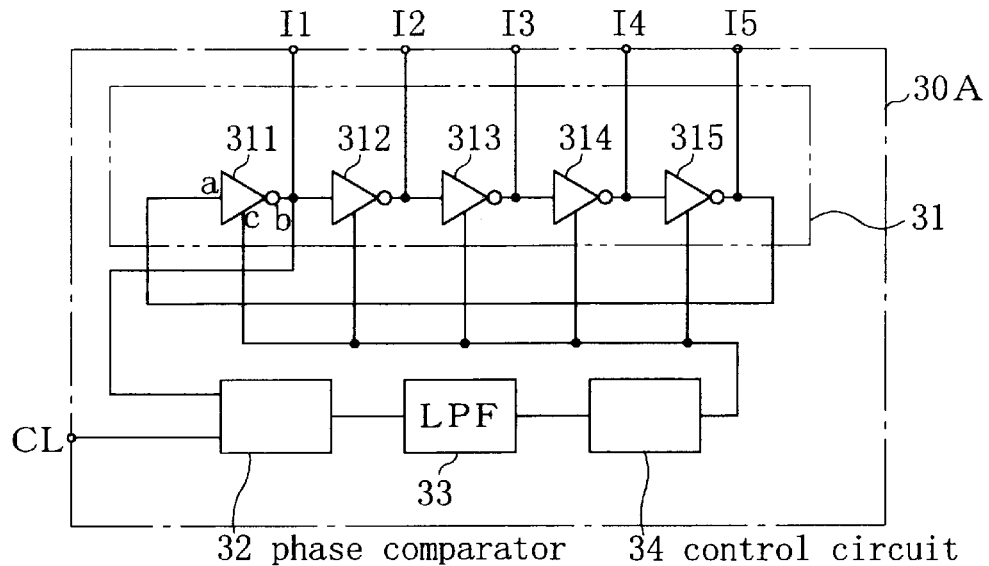
FIG. 4 is a circuit diagram showing the configuration of a first oscillator circuit 30A in the A/D converter in the embodiment of the present invention.

FIG. 4 is a circuit diagram showing the configuration of the first oscillator circuit 30A in the A/D converter in this embodiment shown in FIG. 1. In FIG. 4, the reference numeral 31 denotes a ring of delay circuits including a plurality of (five, in FIG. 4) inverting amplifiers 311 to 315 functioning as delay circuits which are connected to each other to form a ring. Each of the inverting amplifiers 311 to 315 has an input terminal a, an output terminal b and a control terminal c. The signal transmission time is controlled by a voltage applied to the control terminal c. Thus, by controlling the voltages applied to the control terminals a, the oscillation frequency of the ring 31 of delay circuits can be varied. The voltages at the output terminals b of the respective inverting amplifiers 311 to 315 become the output signals $I_1$ to $I_5$ of the first oscillator circuit 30A.

The reference numeral 32 denotes a phase comparator for comparing the phase of the second clock signal S2 input from the second clock generating source 5 into the terminal CL with that of an output signal (i.e., the signal $I_1$) of the ring 31 of delay circuits to determine a phase difference therebetween. The reference numeral 33 denotes a low pass filter (LPF) for averaging the pulse signal output from the phase comparator 32 and then outputting the averaged signal. The reference numeral 34 denotes a control circuit for controlling the oscillation frequency of the ring 31 of delay circuits in accordance with the output voltage of the LPF 33. A phase locked loop (PLL) is formed by the ring 31 of delay circuits, the phase comparator 32, the LPF 33 and the control circuit 34. The oscillation frequency of the ring 31 of delay circuits coincides with the frequency of the second clock signal S2 generated by the second clock generating source 5 even when a power supply voltage or a temperature varies. The PLL used in this embodiment is a generally used one and the detailed operation thereof is well documented. Thus, the description thereof will be omitted herein.

It is in order to maintain a constant oscillation frequency for the ring 31 of delay circuits even when the power supply voltage, the temperature or the like has varied that the PLL is used in this embodiment. Assuming that the inverting amplifiers 311 to 315 constituting the ring 31 of delay circuits have the same configuration, the delay times thereof become equal to each other. Thus, if a constant oscillation frequency can be maintained for the ring 31 of delay circuits, the delay time for one stage of inverting amplifier also becomes constant because the delay time per stage is 1/10 of one oscillation period of the ring 31 of delay circuits (a time required for a signal to take two rounds of the five-stage inverting amplifiers corresponds to one oscillation period of the ring 31 of delay circuits).

Figure 5:
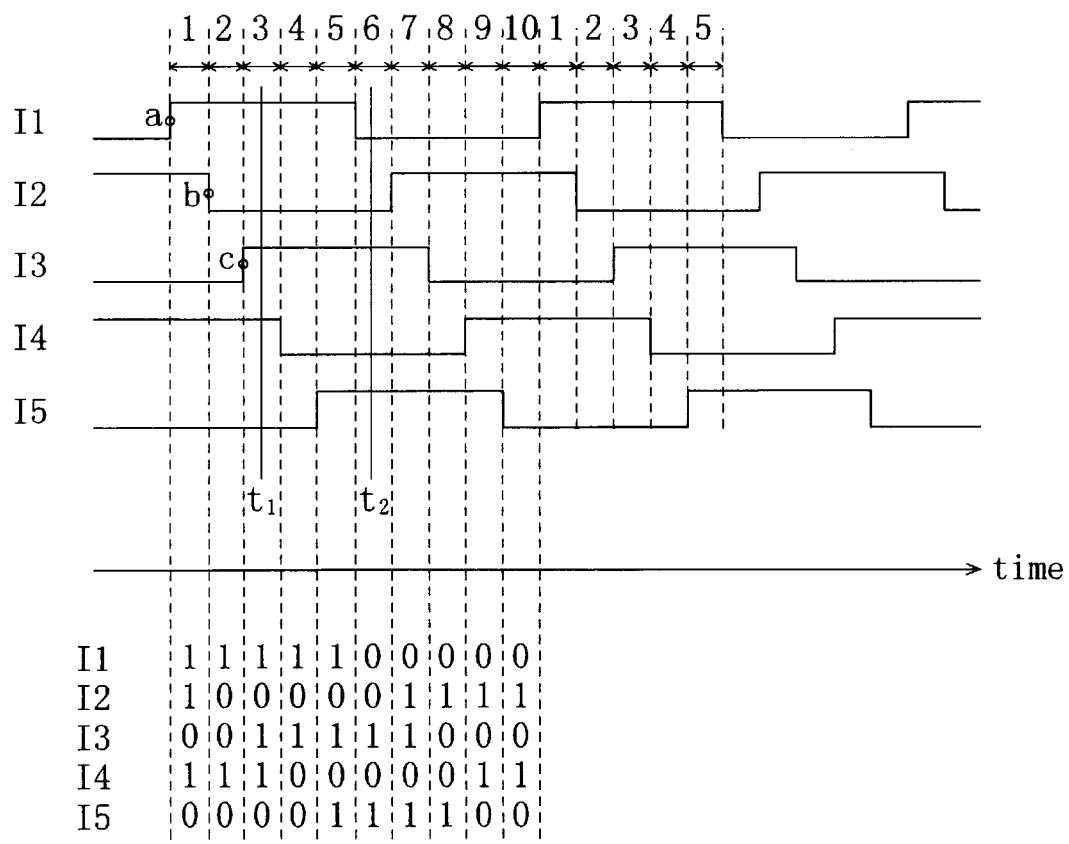
FIG. 5 is a graph illustrating the variations of the output signals $I_1$ to $I_5$ of the first oscillator circuit 30A and a second oscillator circuit 30B with the passage of time.

FIG. 5 is a graph illustrating the variations of the output signals $I_1$ to $I_5$ of the first oscillator circuit 30A and the second oscillator circuit 30B with the passage of time. As shown in FIG. 5, when a delay time for one stage of inverting amplifier has passed since the leading edge a of the output signal $I_1$, the output signal $I_2$ is deasserted (trailing edge b). Next, when a delay time for one stage of inverting amplifier has passed since the trailing edge b of the output signal $I_2$, the output signal $I_3$ is asserted (leading edge c). In this way, the levels of the respective output signals $I_1$ to $I_5$ sequentially changes on the basis of the delay time for one stage of inverting amplifier. Assuming that the "H" level of a signal is represented as bit "1" and the "L" level of the signal is represented as bit "0", the output signals $I_1$ to $I_5$ become five-bit data having 10 kinds of values which are variable on the basis of the delay time for one stage of inverting amplifier, as shown in the lower part of FIG. 5. The transition order of the output signals $I_1$ to $I_5$ does not change and is always fixed. Thus, by using such output signals $I_1$ to $I_5$, a time can be measurement finely.

For example, if the output signals $I_1$ to $I_5$ are held by a flip-flop bank at a time $t_1$, the output signals $I_1$ to $I_5$ are held again by the flip-flop bank at a time $t_2$ and then the two sets of held signals are compared with each other, then it can be seen that a time period corresponding to the delay time for three stages of inverting amplifiers has passed between the times $t_1$ and $t_2$. In this case, assuming that the delay time for one stage of inverting amplifier is 1 ns, a time period of 3 ns has passed between the times $t_1$ and $t_2$.

Next, the operation of the A/D converter in this embodiment shown in FIG. 1 will be described.

FIG. 6 is a timing chart illustrating the generalized operation of the A/D converter in this embodiment shown in FIG. 1. As shown in FIG. 6, the leading edge of the basic clock Si is synchronized with the leading edge of the PLL clock S2 such that the start time of the amplification operation of each of the differential amplifier circuits 10a to 10h constituting the bank 10 of amplifier circuits is synchronous with the start time of the amplification time measuring operation using the output signals $I_1$ to $I_5$ of the first and the second oscillator circuits 30A and 30B. It is noted that the PLL clock S2 is not necessarily required to be the same signal as the basic clock S1, because the PLL clock S2 is a signal used as a reference for maintaining a constant oscillation frequency for the ring 31 of delay circuits of the first and the second oscillator circuits 30A and 30B. Thus, in this embodiment, the first clock generating source 4 for generating the basic clock S1 is provided separately from the second clock generating source 5 for generating the PLL clock S2, and the PLL clock S2 has a frequency twice as high as that of the basic clock S1.

As shown in FIG. 6, each of the differential amplifier circuits 10a to 10h constituting the bank 10 of amplifier circuits performs a reset operation in a period during which the basic clock S1 is at the "L" level, and performs an amplification operation in a period during which the basic clock S1 is at the "H" level. When each of the differential amplifier circuits 10a to 10h starts the amplification operation, an operation of measuring the amplification rate of each of the differential amplifier circuits 10a to 10h, i.e., the amplification time of the output voltages thereof, is started in accordance with the output signals $I_1$ to $I_5$ of the first and the second oscillator circuits 30A and 30B.

FIG. 7 is a diagram illustrating the operation of measuring the amplification time of the output voltage of each of the differential amplifier circuits 10a to 10h. As shown in the upper part of FIG. 7, when a reset period terminates and an amplification period starts, each of the differential amplifier circuits 10a to 10h starts to amplify the voltage difference between the input voltage $V_{in}$ and a reference voltage $V_{rN}$ (where N is an integer from 1 to 8), and thus the output voltage thereof starts to vary. Though each differential amplifier circuit has differential outputs (i.e., a non-inverted output and an inverted output), only one type of output voltage is selectively illustrated in FIG. 7 from the non-inverted output voltage and the inverted output voltage for discussion.

As shown in the lower part of FIG. 7, the frequency of the PLL clock S2 is twice as high as that of the basic clock S1, and the leading edge of the PLL clock S2 is synchronous with the transition time of the basic clock S1. On the other hand, since the PLL in the first and the second oscillator circuits 30A and 30B shown in FIG. 4 performs a control operation, the frequency and the phase of the PLL clock S2 are matched with those of the output signal of the inverting amplifier 311 (i.e., the output signal $I_1$ of the first and the second oscillator circuits 30A and 30B). Thus, as shown in the middle part of FIG. 7, the transition time between the reset operation and the amplification operation of each of the differential amplifier circuits 10a to 10h constituting the bank 10 of amplifier circuits is synchronous with the leading edge of the output signal $I_1$ of the first and the second oscillator circuits 30A and 30B.

The output voltage of each of the differential amplifier circuits starts to vary from the start point voltage $V_S$ (i.e., the output voltage during the reset operation) to reach a voltage $V_1$ used as a reference (i.e., a predetermined voltage applied to the inverting input terminal of each of the comparators shown in FIG. 3), when the output signals $I_1$ to $I_5$ of the first and the second oscillator circuits 30A and 30B are held by a flip-flop bank associated with each said differential amplifier circuit.

For example, assuming that the level of the inverted output signal a– of the differential amplifier circuit 10a varies as shown in the upper graph in FIG. 7, the output signal of the comparator 23a changes from the "L" level into the "H" level when the level of the signal a– exceeds the level of the voltage $V_1$. Thus, when the signal input to the clock terminal C1 is asserted, i.e., when the level of the inverted output signal a– of the differential amplifier circuit 10a reaches the level of the voltage $V_1$, the flip-flop bank 21a holds the output signals $I_1$ to $I_5$ of the first oscillator circuit 30A which have been input to the input terminals D1 to D5, respectively. Since the transition order of the output signals $I_1$ to $I_5$ is fixed, it can be seen from the middle part of FIG. 7 that the time when the level of the inverted output signal a– of the differential amplifier circuit 10a reaches the level of the voltage $V_1$ corresponds to the fifth signal transition in the ring 31 of delay circuits. Assuming that the signal transition time for one stage of inverting amplifier in the ring 31 of delay circuits is 1 ns, the differential amplifier circuit 10a has required an amplification time of 5 ns (including an quantization error of 1 ns).

The amplification time of each of the differential amplifier circuits 10a to 10h constituting the bank 10 of amplifier circuits can be measured in this way.

Next, the principles of the A/D conversion to be performed in this embodiment by using the amplification times of the respective differential amplifier circuits 10a to 10h constituting the bank 10 of amplifier circuits will be described with reference to FIG. 8.

Figure 8A:
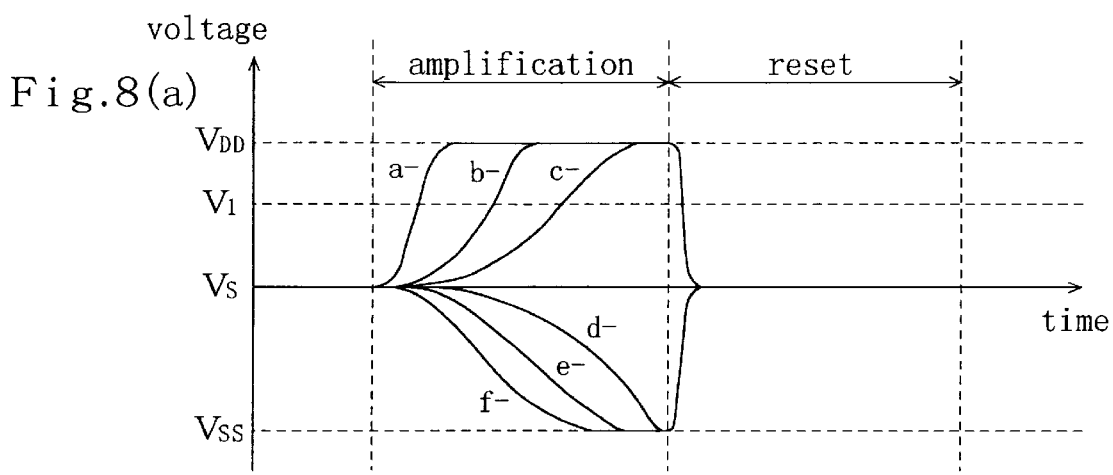
FIGS. 8(a), 8(b) and 8(c) are diagrams illustrating how an A/D converted value is obtained in the embodiment of the present invention.

FIG. 8(a) is a graph illustrating the inverted output voltages a– to f– of the differential amplifier circuits 10a to 10f, respectively. In FIG. 8(a), the analog signal $V_{in}$ is assumed to have a voltage between the reference voltage $V_{r3}$ of the third differential amplifier circuit 10c and the reference voltage $V_{r4}$ of the fourth differential amplifier circuit 10d.

Assuming that the inverted output voltages of the respective differential amplifier circuits 10a to 10h are denoted by $V_{oN}$– and the non-inverted output voltages thereof are denoted by $V_{oN}$+ (where N is an integer from 1 to 8), the voltages $V_{oN}$– and $V_{oN}$+ are given by the following Equations (2) and (3).

$$V_{oN}-=-G\cdot(V_{in}-V_{rN})+V_S \qquad (2)$$

$$V_{oN}+=G\cdot(V_{in}-V_{rN})+V_S \qquad (3)$$

where G (>0) is a voltage gain of each of the differential amplifier circuits 10a to 10h. When the signal $V_{in}$ has a voltage between the reference voltages $V_{r3}$ and $V_{r4}$, the following relationship is derived from Equation (2), $$V_{o1}->V_{o2}->V_{o3}->V_S->V_{o4}->V_{o5}->V_{o6}->V_{o7}->V_{o8}-$$

thus, this relationship can be rewritten as the following Inequality (4).

$$\therefore a->b->c->V_S>d->e->f->g->h- \qquad (4)$$

As can be seen from Inequality (4), the inverted output voltages a–, b– and c– of the first to the third differential amplifier circuits 10a to 10c increase from the voltage $V_S$ to exceed the voltage $V_1$. On the other hand, the inverted output voltages d–, e–, f–, g– and h– of the fourth to the eighth differential amplifier circuits 10d to 10h do not exceed the voltage $V_1$ because these output voltages decreases from the voltage $V_S$. Instead, the non-inverted output voltages d+, e+, f+, g+ and h+ of the fourth to the eighth differential amplifier circuits 10d to 10h do exceed the voltage $V_1$.

Thus, since both the inverted output signal c– of the third differential amplifier circuit 10c and the noninverted output signal d+ of the fourth differential amplifier circuit 10d exceed the voltage $V_1$, it can be seen that the analog signal $V_1$ has a voltage between the reference voltages $V_{r3}$ and $V_{r4}$. Based on this fact, the higher-order A/D converted value of the analog signal $V_{in}$ can be obtained.

The A/D converter of this embodiment performs a more precise A/D conversion of the analog signal $V_{in}$ by using the amplification times of the respective differential amplifier circuits 10a to 10h. This conversion is the lower-order A/D conversion and is performed in the following manner.

Figure 8B:
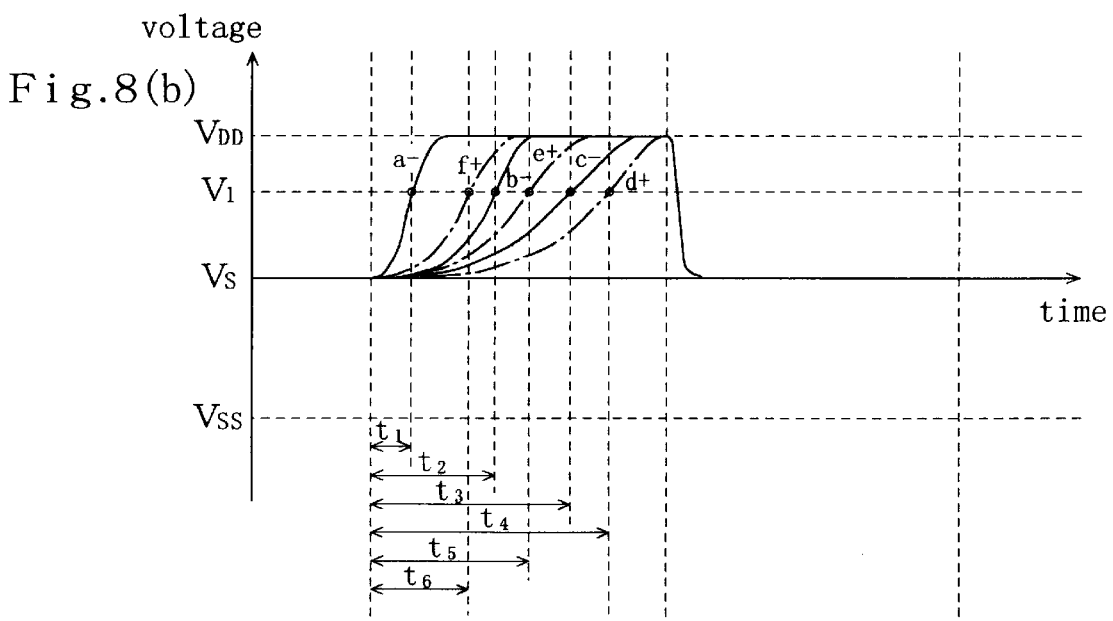
Figure 8C:
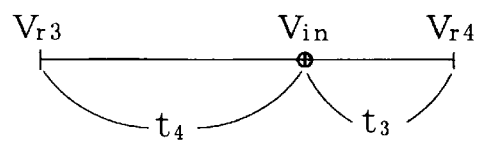

FIG. 8(b) is a graph showing the inverted output voltages a– to c– of the first to the third differential amplifier circuits 10a to 10c and the non-inverted output voltages d+ to f+ of the fourth to the sixth differential amplifier circuits 10d to 10f. In the lower part of this graph, the times required for the respective output voltages to reach the voltage $V_1$ are also shown. Specifically, $t_1$ to $t_3$ respectively denote times required for the inverted output voltages a– to c– of the first to the third differential amplifier circuits 10a to 10c to reach the voltage $V_1$, while $t_4$ to $t_6$ respectively denote times required for the non-inverted output voltages d+ to f+ of the fourth to the sixth differential amplifier circuits 10d to 10f to reach the voltage $V_1$.

In this case, the relationship among a time $t_N$ (where N is an integer from 1 to 8), the analog signal $V_{in}$ and a reference voltage $V_{rN}$ (where N is also an integer from 1 to 8) is approximately represented by the following Equations (5) and (6).

$$\text{When } V_{in}<V_{rN}: t_N=-H/(V_{in}-V_{rN}) \qquad (5)$$

$$\text{When } V_{in}>V_{rN}: t_N=H/(V_{in}-V_{rN}) \qquad (6)$$

In Equations (5) and (6), H (>0) denotes a proportion constant to be determined in accordance with the design of the differential amplifier circuit. In this case, only when N=1 to 3, the relationship $V_{in}<V_{rN}$ is satisfied. On the other hand, when N=4 to 8, the relationship $V_{in}>V_{rN}$ is satisfied.

Since the absolute value of the voltage difference between the voltage of the analog signal $V_{in}$ and the reference voltage $V_{r3}$ in the third differential amplifier circuit $10c$ is smaller than the absolute value of the voltage difference between the voltage of the analog signal $V_{in}$ and any of the reference voltages $V_{r1}$ and $V_{r2}$ of the first and the second differential amplifier circuit $10a$ and $10b$, the time $t_3$ becomes longer than any of the times $t_1$ and $t_2$. On the other hand, since the absolute value of the voltage difference between the voltage of the analog signal $V_{in}$ and the reference voltage $V_{r4}$ in the fourth differential amplifier circuit $10d$ is smaller than the absolute value of the voltage difference between the voltage of the analog signal $V_{in}$ and any of the reference voltages $V_{r5}$ to $V_{r8}$ of the fifth to the eighth differential amplifier circuit $10e$ to $10h$, the time $t_4$ becomes longer than any of the times $t_5$ to $t_8$. By substituting 3 and 4 for N in Equations (5) and (6), respectively, the following Equations (7) and (8) are obtained.

$$t_3=-H/(V_{in}-V_{r3}) \quad (7)$$

$$t_4=H/(V_{in}-V_{r4}) \quad (8)$$

Herein, the ratio of the time $t_3$ to the time $t_4$ is given by the following Equation (9).

$$t_3/t_4=-(V_{in}-V_{r4})/(V_{in}-V_{r3}) \quad (9)$$

If Equation (9) is rewritten with respect to $V_{in}$, then the following Equation (10) is obtained.

$$V_{in}=(t_3 \cdot V_{r3}+t_4 \cdot V_{r4})/(t_3+t_4) \quad (10)$$

Equation (10) indicates that the voltage of the analog signal $V_{in}$ between the reference voltages $V_{r3}$ and $V_{r4}$ can be located based on the times $t_3$ and $t_4$. That is to say, since Equation (10) is similar to a so-called interior division equation, it can be seen that the voltage of the analog signal $V_{in}$ is located at a position interiorly dividing the difference between the reference voltages $V_{r3}$ and $V_{r4}$ at a ratio of $t_4$:$t_3$ (see FIG. 8(c)). Thus, by using Equation (10), the lower-order A/D converted value of the analog signal $V_{in}$ can be obtained. If the quantization time in the first and the second oscillator circuits 30A and 30B (i.e., the signal delay time for one stage of differential amplifier constituting the ring 31 of delay circuits) is further subdivided, then the times $t_3$ and $t_4$ can be measured more exactly and the lower-order A/D converted value of the analog signal $V_{in}$ can be obtained more precisely.

The operation for the lower-order A/D conversion based on the digital values representing the amplification times of the respective differential amplifier circuits $10a$ to $10h$ (i.e., the operation given by Equation (10)) is performed by the time operational circuit 41. The converted value arithmetic circuit 42 computes and combines the higher-order A/D converted value and the lower-order A/D converted value from the data obtained by the time operational circuit 41, thereby computing the digital value representing the analog signal $V_{in}$ to be converted.

It is noted that Equation (10) is obtained by supposing that the relationships represented by Equations (5) and (6) are satisfied. That is to say, by supposing that the amplification time is approximately inversely proportional to the difference between the input voltages in a differential amplifier circuit, a voltage at a point interiorly dividing the difference between two reference voltages at the ratio of the amplification times is defined as the voltage of the analog signal $V_{in}$. Thus, the lower-order A/D conversion is realized by a simple operation. In order to perform the lower-order A/D conversion more precisely, the operation may also be performed in view of the exponential relationship between the amplification rate and the difference between the input voltages in a real differential amplifier circuit.

In this embodiment, as shown in FIG. 8(b), the non-inverted output voltages of the differential amplifier circuits having reference voltages lower than the voltage of the analog signal $V_{in}$ and the inverted output voltages of the differential amplifier circuits having reference voltages higher than the voltage of the analog signal $V_{in}$ are used for performing the lower-order A/D conversion. This is in order to reduce the influence of the dynamic offset of each differential amplifier circuit upon the precision of the A/D conversion.

Figure 9A:
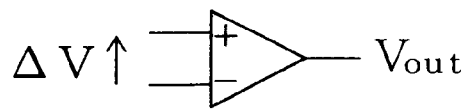
FIGS. 9(a) and 9(b) are diagrams illustrating a dynamic offset.
Figure 9B:
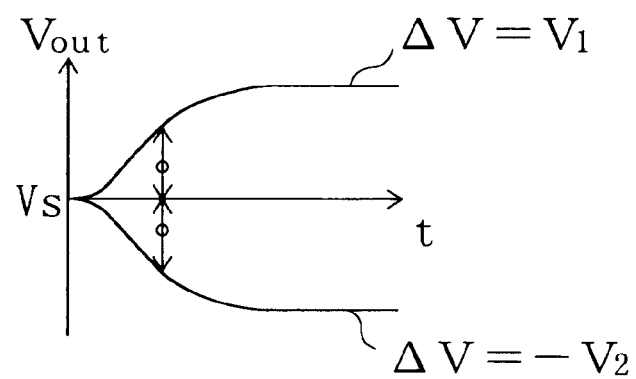

The dynamic offset will be described with reference to FIG. 9. Herein, an amplifier circuit, such as that shown in FIG. 9(a), for amplifying an input voltage difference $\Delta V$ so as to output a voltage $V_{out}$ is considered. If the difference between the output voltage $V_{out}$ and the reference voltage $V_S$ when the input voltage difference $\Delta V$ is equal to $V_1$ (>0) is equal to the difference when the input voltage difference $\Delta V$ is equal to $V_2$ (<0) as shown in FIG. 9(b), the difference between $V_1$ and $V_2$ is called a dynamic offset. In an ideal differential amplifier circuit, the dynamic offset is zero. However, in actuality, the dynamic offset does not becomes zero because of the variations caused during the fabrication process thereof. If the dynamic offset is not zero, then the difference between the output voltage $V_{out}$ and the reference voltage $V_S$ is variable depending upon whether the input voltage difference $\Delta V$ is positive or negative, even when the absolute values of the positive and the negative differences $\Delta V$ are equal to each other.

FIG. 10 is a drawing explaining the reasons why the influence of the dynamic offset can be reduced in this embodiment. As shown in FIG. 10(a), the voltage of the analog signal $V_{in}$ is assumed to be higher than the reference voltage $V_{r4}$ and is lower than the reference voltage $V_{r3}$. In such a case, in the fourth differential amplifier circuit $10d$, since the non-inverting input voltage (the voltage of the analog signal $V_{in}$) is higher than the inverting input voltage (the reference voltage $V_{r4}$), the input voltage difference $\Delta V$ thereof is positive. On the other hand, in the third differential amplifier circuit $10c$, since the non-inverting input voltage (the voltage of the analog signal $V_{in}$) is lower than the inverting input voltage (the reference voltage $V_{r3}$), the input voltage difference $\Delta V$ thereof is negative. Since the polarities of the input voltage differences $\Delta V$ are different from each other, if the non-inverted output voltages of both the third and the fourth differential amplifier circuits $10c$ and $10d$ are used for the A/D conversion, then an error is caused in the A/D converted value because of the existence of the dynamic offset. The same result is obtained when the inverted output voltages of both the third and the fourth differential amplifier circuits $10c$ and $10d$ are used for the A/D conversion.

On the other hand, as shown in FIG. 10(b), it is known that the non-inverted output voltage of a differential amplifier circuit having a non-inverting input voltage of A and an inverting input voltage of B is equivalent in respect of dynamic offset to the inverted output voltage of a differential amplifier circuit having an inverting input voltage of A and a non-inverting input voltage of B owing to the characteristics of a differential amplifier circuit.

Thus, the case where the inverted output voltage of the third differential amplifier circuit $10c$ and the non-inverted output voltage of the fourth differential amplifier circuit 10*d* are used for the A/D conversion as shown in FIG. 10(*a*) is equivalent to the case shown in FIG. 10(*c*). That is to say, in view of the dynamic offset, in the third differential amplifier circuit 10*c*, a relatively high reference voltage $V_{r3}$ becomes a non-inverting input voltage, a relatively low voltage of the analog signal $V_{in}$ becomes an inverting input voltage, and the non-inverted output voltage is used for the lower-order A/D conversion. As a result, the polarities of the input voltage differences $\Delta V$ of the third and the fourth differential amplifier circuits 10*c* and 10*d* are equal to each other and the non-inverted output voltages are used for the A/D conversion in both of these amplifier circuits, so that the dynamic offset is canceled. It is noted that the output voltages used for the A/D conversion are identified by "○" and the output voltages not used for the A/D conversion are identified by "X" in FIGS. 10(*a*) and 10(*c*).

Thus, by using the non-inverted output voltage of a differential amplifier circuit having a reference voltage lower than the voltage of the analog signal $V_{in}$ and the inverted output voltage of a differential amplifier circuit having a reference voltage higher than the voltage of the analog signal $V_{in}$ for the lower-order A/D conversion, the influence of the dynamic offset of each of the differential amplifier circuits upon the precision of the A/D conversion can be reduced. Naturally, by using the inverted output voltage of a differential amplifier circuit having a reference voltage lower than the voltage of the analog signal $V_{in}$ and the non-inverted output voltage of a differential amplifier circuit having a reference voltage higher than the voltage of the analog signal $V_{in}$, the influence of the dynamic offset of each of the differential amplifier circuits upon the precision of the A/D conversion can also be reduced.

Moreover, in a real A/D converter, the voltage of the analog signal $V_{in}$ is substantially equal to the reference voltage. Thus, a differential amplifier circuit in which both the non-inverted output voltage and the inverted output voltage hardly vary and do not reach the voltage $V_1$ possibly exists. In such a case, the A/D conversion is performed as follows.

FIG. 11(*a*) is a graph showing the inverted output voltages a– to e– of the differential amplifier circuits 10*a* to 10*e*. In FIG. 11(*a*), the voltage of the analog signal $V_{in}$ is substantially equal to the reference voltage $V_{r3}$ of the third differential amplifier circuit 10*c* and the noninverted output voltage c+ of the third differential amplifier circuit 10*c* is also shown. FIG. 11(*b*) is a graph showing the inverted output voltages a– to c– of the first to the third differential amplifier circuits 10*a* to 10*c* and the non-inverted output voltages c+ to e+ of the third to the fifth differential amplifier circuits 10*c* to 10*e*. In the lower part of FIG. 11(*b*), the times required for the respective output voltages to reach the voltage $V_1$ are additionally shown, in which $t_1$ and $t_2$ represent the times required for the inverted output voltages a– and b– of the first and the second differential amplifier circuits 10*a* and 10*b* to reach the voltage $V_1$, respectively, and $t_4$ and $t_5$ represent the times required for the non-inverted output voltages d+ and e+ of the fourth and the fifth differential amplifier circuits 10*d* and 10*e* to reach the voltage $V_1$, respectively.

As shown in FIG. 10(*a*), since the third differential amplifier circuit 10*c* cannot detect the voltage difference between the voltage of the analog signal $V_{in}$ and the reference voltage $V_{r3}$ in this case, the inverted output voltage c– and the non-inverted output voltage c+ either do not vary from the voltage $V_S$ or do not reach the voltage $V_1$ during the amplification period, even when the voltages do vary.

Thus, as shown in FIG. 11(*b*), since the data about the time $t_3$ cannot be obtained, the A/D conversion is performed by using the times $t_2$ and $t_4$. The lower-order A/D conversion is performed by obtaining an interiorly divided point of the analog voltage $V_{in}$ in accordance with the following Equation (11).

$$V_{in}=(t_2 \cdot V_{r2}+t_4 \cdot V_{r4})/(t_2+t_4) \qquad (11)$$

The higher-order A/D conversion is performed by identifying a differential amplifier circuit having the longest amplification time and a differential amplifier circuit having the second longest amplification time from the differential amplifier circuits 10*a* to 10*h* constituting the bank 10 of amplifier circuits. For example, in the above-described case shown in FIG. 8, since the amplification time of the fourth differential amplifier circuit 10*d* is the longest and the amplification time of the third differential amplifier circuit 10*c* is the second longest, it is determined that the voltage of the input analog signal $V_{in}$ is located between the reference voltages $V_{r3}$ and $V_{r4}$. On the other hand, in the case shown in FIG. 11, since the amplification time of the fourth differential amplifier circuit 10*d* is the longest, the amplification time of the second differential amplifier circuit 10*b* is the second longest and the data representing the amplification time of the third differential amplifier circuit 10*c* does not exist, it is determined that the voltage of the analog signal $V_{in}$ is substantially equal to the reference voltage $V_{r3}$. In this way, the upper bits of the A/D converted value can be obtained.

Furthermore, the A/D converter of this embodiment can be divided into several blocks (or units). Specifically, in the A/D converter shown in FIG. 1, there are two groups of flip-flop banks and two oscillator circuits, and one block is composed of the first group 20A of flip-flop banks, the first oscillator circuit 30A and the first to the fourth differential amplifier circuits 10*a* to 10*d*, while another block is composed of the second group 20B of flip-flop banks, the second oscillator circuit 30B and the fifth to the eighth differential amplifier circuits 10*e* to 10*h*.

Hereinafter, the reasons why the A/D converter in this embodiment may be divided into blocks will be described.

In general, the precision of an A/D converter is improved by using the relative values of the output signals of a plurality of amplifiers. In this respect, the same rule is true of the A/D converter in this embodiment. However, the A/D converter in this embodiment is different from a conventional high-precision A/D converter in that the output signals of a plurality of amplifiers are not used directly as analog signals, but instead used for improving the precision of the A/D conversion after the amplification times of the amplifiers have been converted into digital values.

Figure 12B:
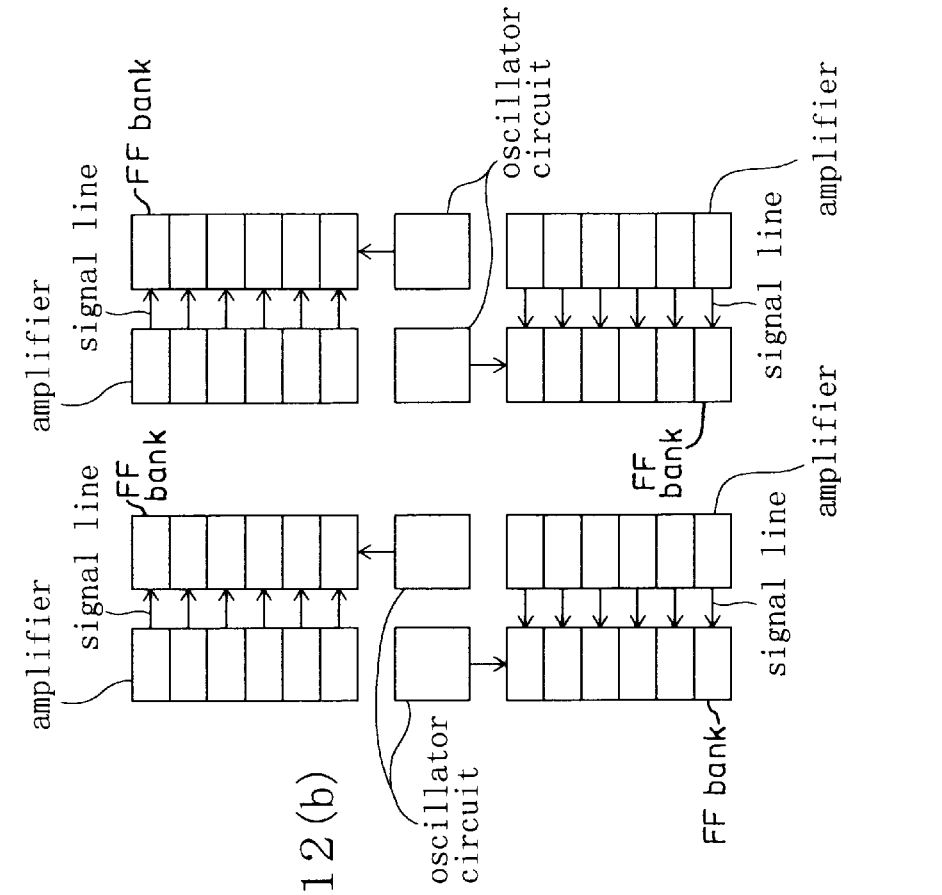
FIGS. 12(a) and 12(b) are diagrams showing the change of the layout because of a blocking realized in the A/D converter in the embodiment of the present invention.
Figure 12A:
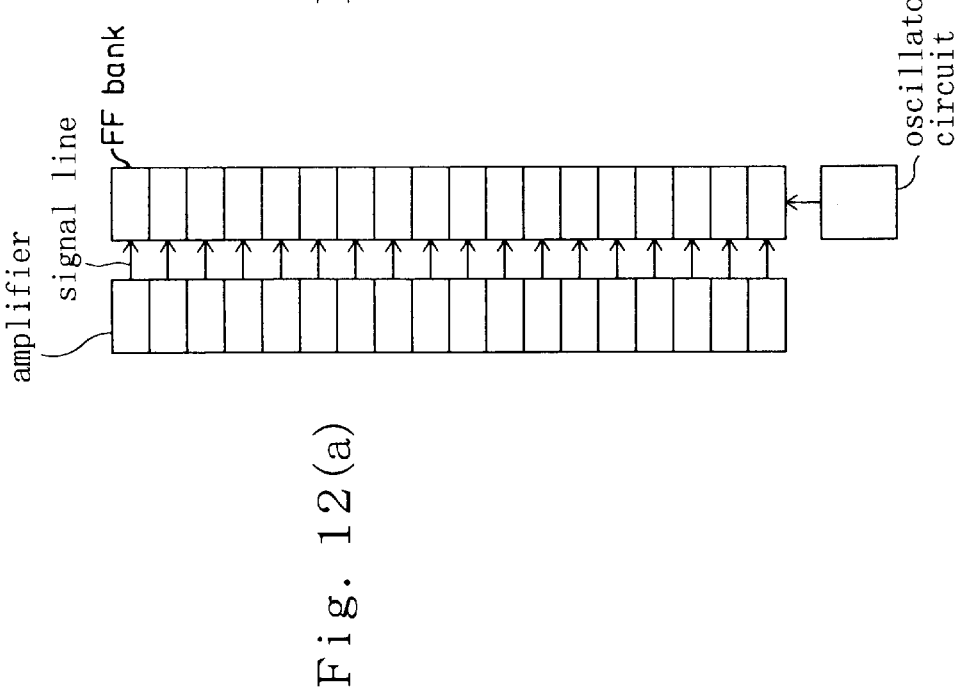

A conventional high-precision A/D converter compares the relative levels of the output signals of the amplifiers with each other while leaving the output signals original analog signals. Thus, in such a case, the variations in lengths of the output signal lines of the respective amplifiers adversely affect the precision of the A/D conversion, and the layout of the A/D converter is disadvantageously limited. Nevertheless, if the lengths of the output signal lines of the amplifiers are equalized so as not to cause a conversion error, then an elongated layout such as that shown in FIG. 12(*a*) cannot but be selected for converting an increased number of bits.

On the other hand, the A/D converter in this embodiment digitally converts the amplification times of the respective amplifiers and then compares the digital values with each other among a plurality of amplifiers. Consequently, since the variations in lengths of the output signal lines of the respective amplifiers do not affect the precision of the A/D conversion, the flexibility of layout is increased as compared with a conventional high-precision A/D converter, and the A/D converter according to the present invention can be developed as a blocked layout such as that shown in FIG. 12(b).

It is noted that each of the first and the second groups 20A and 20B of flip-flop banks may be configured such that the output voltages of the respective differential amplifier circuits are directly input to the terminals C1 of the respective flip-flop banks omitting the comparators therefrom. In such a case, the voltage $V_1$ used as a reference for measuring the amplification times may be set as a threshold voltage of a clock signal for the respective flip flops constituting the first and the second groups 20A and 20B of flip-flop banks.

Moreover, if each of the first and the second groups 20A and 20B of flip-flop banks is configured such that the non-inverted output voltage and the inverted output voltage of each differential amplifier circuit are input to a common flip-flop bank, then the number of flip-flop banks may be halved. In such a case, the number of the digital values representing the amplification time of each differential amplifier circuit is halved to be one. However, in order to digitally correct the lower-order A/D converted value with a higher precision, the configuration of this embodiment, in which a pair of flip-flop banks are provided for the noninverted output voltage and the inverted output voltage of each differential amplifier circuit, respectively, is more preferable.

Furthermore, the number of flip flops constituting each flip-flop bank is not limited to five, but may be selected in accordance with the number of signals output from the oscillator circuit.

In this embodiment, each differential amplifier circuit is assumed to alternately perform a reset operation for outputting a constant voltage and an amplification operation. However, the present invention is not limited thereto, but each differential amplifier circuit may not perform a reset operation. That is to say, though the voltage $V_S$ set by the reset operation is used as a start point voltage for measuring the amplification time in this embodiment, the maximum or the minimum output voltage of each differential amplifier circuit may be set instead as the start point voltage for measuring the amplification time.

The A/D conversion according to the present invention realizes a considerably higher processing rate as compared with a conventional A/D conversion utilizing interpolation technologies in which an interpolation is performed by amplifying the voltages in order to improve the precision. In such a conventional A/D conversion utilizing interpolation technologies, a voltage range to which an analog signal belongs is amplified and the lower-order A/D conversion is performed in the amplified voltage range, thereby improving the precision. However, in accordance with this method, a voltage is required to be amplified with a high amplification factor. Thus, since it takes a long time to perform the voltage amplification, the A/D conversion cannot be performed at a high rate. For example, in the case of four-bit (=16 scales) interpolating a voltage range of 8 mV, the amplification must be performed with as high an amplification factor as 16, and thus it takes a long time to perform the voltage amplification.

In contrast, according to the present invention, the amplification times of the respective differential amplifier circuits are measured during the higher-order A/D conversion, and then the lower-order A/D conversion is performed in accordance with the amplification times. Thus, the A/D conversion can be performed at a rate considerably higher than a conventional rate without requiring a long voltage amplification time any longer. Consequently, the present invention realizes an A/D conversion for simultaneously satisfying high-rate processing and high precision.

Figure 13:
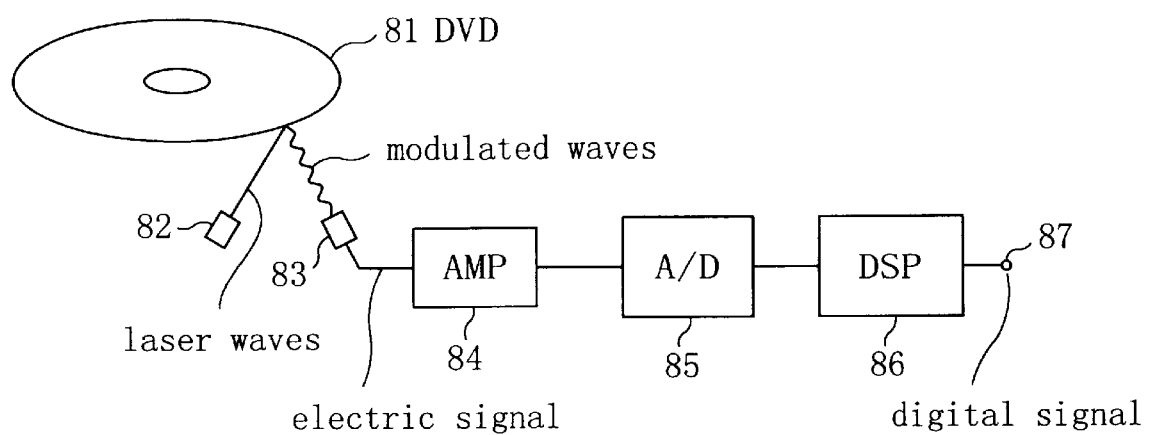
FIG. 13 is a diagram showing a schematic configuration of a DVD system including an A/D converter.

The high-rate and high-precision A/D conversion realized by the present invention may find various applications. For example, the present invention is applicable to reading a signal from a magnetic recording medium such as a DVD, an HDD, a PD and an MO. FIG. 13 is a diagram showing a schematic configuration of a signal reading section of a DVD system. In FIG. 13, the reference numeral 81 denotes a DVD; 82 denotes a laser oscillator; 83 denotes a laser light receiving section; 84 denotes a filter-integrated amplifier (AMP); 85 denotes an A/D converter; 86 denotes a digital signal processing section (DSP); and 87 is an output terminal which outputs a read digital signal and is connected to a next-stage circuit (such as a circuit for converting the digital signal into an image).

The laser waves emitted by the laser oscillator 82 are modulated (e.g., frequency-modulated) by the DVD 81, and the modulated waves are converted by the laser light receiving section 83 into an electric signal. The electric signal is amplified and the waveform thereof is shaped by the filter-integrated amplifier 84. Then, the signal is converted by the A/D converter 85 into a digital signal.

In this case, since the modulation frequency of the electric signal is high and the precision of the resulting digital data is required to be at a high level, a high-rate and high-precision A/D converter is required to be used as the A/D converter 85. It is expected that the recording density of a magnetic recording medium will become even higher and the read precision will be required to be further improved in the near future. In such a situation, since an even higher rate and an even higher precision will necessarily be required for the A/D converter 85, the present invention will be more and more significant correspondingly.

As is apparent from the foregoing description, according to the present invention, the difference in amplification rates of respective amplifier circuits reflects the difference in voltage differences between the voltage of the analog signal to be converted and the reference voltages of the respective amplifier circuits. Thus, by performing the A/D conversion based on the amplification rates of the respective amplifier circuits, it is possible to determine a point where the voltage of the analog signal is located between adjacent reference voltages and which has not been obtained by the prior art using only the level relationship between the voltage of the analog signal and the respective reference voltages as the information about the A/D conversion. Consequently, the present invention realizes an A/D conversion with a higher precision than that of the conventional A/D conversion which has been limited by the variations in offset voltages proper to the amplifier circuits.

What is claimed is:

1. An A/D converter for converting an analog signal into a digital value, comprising
    a plurality of amplifier circuits, each said amplifier circuit amplifying a voltage difference between a voltage of the analog signal to be converted and a predetermined reference voltage associated with each said amplifier circuit, and
    a conversion section for obtaining the digital value representing the analog signal based on amplification rates of the respective amplifier circuits.

2. An A/D converter according to claim 1, wherein the conversion section comprises time counting means for counting respective amplification times of the plurality of amplifier circuits, and operation means for computing the digital value representing the analog signal based on a plurality of count values output from the time counting means.

3. An A/D converter according to claim 2, wherein the time counting means comprises an oscillator circuit for outputting signals having levels variable with the passage of time, and a plurality of holding circuit banks provided so as to be associated with the respective amplifier circuits, each said holding circuit bank holding the output signals of the oscillator circuit when an output voltage of the amplifier circuit associated with each said holding circuit bank reaches a predetermined voltage, whereby the time counting means obtains the count values representing the amplification times of the respective amplifier circuits based on the signals held by the plurality of holding circuit banks.

4. An A/D converter according to claim 3, wherein the oscillator circuit comprises a ring of delay circuits, including a plurality of delay circuits connected to each other to form a ring, in which signal levels cyclically change in accordance with an oscillation, output signals of the delay circuits constituting the ring of delay circuits being the output signals of the oscillator circuit.

5. An A/D converter according to claim 4, wherein each said amplifier circuit switches a reset operation for outputting a constant voltage and an amplification operation in response to a first clock signal, and wherein the oscillator circuit forms a phase locked loop (PLL) for controlling an oscillation frequency of the ring of delay circuits to be constant with reference to a second clock signal having a constant frequency, and wherein the frequencies and phases of the first and the second clock signals are set such that a start of the amplification operation performed by each said amplifier circuit is synchronous with a start of a counting operation performed by the time counting means.

6. An A/D converter according to claim 2, wherein the operation means identifies a first amplifier circuit having a reference voltage higher than the voltage of the analog signal and a second amplifier circuit having a reference voltage lower than the voltage of the analog signal from the plurality of amplifier circuits based on the plurality of count values output from the time counting means, and determines a voltage, being located at a point interiorly dividing a difference between the reference voltage of the first amplifier circuit and the reference voltage of the second amplifier circuit by a ratio of the amplification time of the second amplifier circuit to the amplification time of the first amplifier circuit, as the voltage of the analog signal.

7. An A/D converter according to claim 2, wherein the plurality of amplifier circuits are divided into a plurality of groups, and wherein the time counting means is also divided into a plurality of blocks corresponding to the respective groups of the amplifier circuits.

8. An A/D converter according to claim 1, wherein the conversion section obtains the digital value representing the analog signal based on either one type of output voltage of a non-inverted output voltage and an inverted output voltage for the amplifier circuit having reference voltage lower than the voltage of the analog signal among the plurality of amplifier circuits and based on the other type of output voltage of a non-inverted output voltage and an inverted output voltage for the amplifier circuit having reference voltage higher than the voltage of the analog signal, respectively.

9. An A/D converter according to claim 8, wherein the conversion section comprises time counting means for counting respective amplification times of the plurality of amplifier circuits based on either one type of output voltage of a non-inverted output voltage and an inverted output voltage for the amplifier circuit having reference voltage lower than the voltage of the analog signal and based on the other type of output voltage of a non-inverted output voltage and an inverted output voltage for the amplifier circuit having reference voltage higher than the voltage of the analog signal, respectively, and operation means for computing the digital value representing the analog signal based on the plurality of count values output from the time counting means.

10. An A/D conversion method for converting an analog signal into a digital value, comprising an amplification process of amplifying, by using a plurality of amplifier circuits, a voltage difference between a voltage of the analog signal to be converted and a predetermined reference voltage associated with each said amplifier circuit, and a conversion process of obtaining the digital value representing the analog signal based on amplification rates of the respective amplifier circuits.

11. An A/D conversion method according to claim 10, wherein the conversion process comprises a first step of obtaining a first time required for a first amplifier circuit having a reference voltage higher than the voltage of the analog signal to perform an amplification and a second time required for a second amplifier circuit having a reference voltage lower than the voltage of the analog signal to perform an amplification, and a second step of determining a voltage, being located at a point interiorly dividing a difference between the reference voltage of the first amplifier circuit and the reference voltage of the second amplifier circuit by a ratio of the second time to the first time, as the voltage of the analog signal.

12. An A/D conversion method according to claim 11, wherein in the first step, the first time is obtained based on either one type of output voltage of a non-inverted output voltage and an inverted output voltage of the first amplifier circuit, while the second time is obtained based on the other type of output voltage of a non-inverted output voltage and an inverted output voltage of the second amplifier circuit.

* * * * *